United States Patent
Wang et al.

(10) Patent No.: US 7,582,564 B2
(45) Date of Patent: Sep. 1, 2009

(54) PROCESS AND COMPOSITION FOR CONDUCTIVE MATERIAL REMOVAL BY ELECTROCHEMICAL MECHANICAL POLISHING

(75) Inventors: Zhihong Wang, Santa Clara, CA (US); You Wang, Cupertino, CA (US); Daxin Mao, Cupertino, CA (US); Renhe Jia, Berkeley, CA (US); Stan D. Tsai, Fremont, CA (US); Yongqi Hu, San Jose, CA (US); Yuan A. Tian, San Jose, CA (US); Liang-Yuh Chen, Foster City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 754 days.

(21) Appl. No.: 11/123,274

(22) Filed: May 5, 2005

(65) Prior Publication Data

US 2005/0218010 A1 Oct. 6, 2005

Related U.S. Application Data

(63) Continuation-in-part of application No. 10/845,754, filed on May 14, 2004, which is a continuation-in-part of application No. 10/608,404, filed on Jun. 26, 2003, which is a continuation-in-part of application No. 10/456,220, filed on Jun. 6, 2003, which is a continuation-in-part of application No. 10/378,097, filed on Feb. 26, 2003, now Pat. No. 7,128,825, and a continuation-in-part of application No. 10/038,066, filed on Jan. 3, 2002, now Pat. No. 6,811,680, application No. 11/123,274, which is a continuation-in-part of application No. 11/074,274, filed on Mar. 7, 2005, which is a continuation of application No. 10/141,459, filed on May 7, 2002, now Pat. No. 6,863,787, which is a continuation-in-part of application No. 10/032,275, filed on Dec. 21, 2001, now Pat. No. 6,899,804.

(60) Provisional application No. 60/359,746, filed on Feb. 26, 2002, provisional application No. 60/275,874, filed on Mar. 14, 2001.

(51) Int. Cl.
*H01L 21/302* (2006.01)

(52) U.S. Cl. ............. 438/689; 438/692; 438/693; 438/633; 438/687; 438/637; 252/79.1

(58) Field of Classification Search ............ 438/689; 252/79.1; 451/9
See application file for complete search history.

(56) References Cited

U.S. PATENT DOCUMENTS 2,582,020 A 1/1952 Emery (Continued)

FOREIGN PATENT DOCUMENTS

EP 0 527 537 2/1993

(Continued)

OTHER PUBLICATIONS

International Search Report and the Written Opinion for International Application No. PCT/US2006/015386 dated Oct. 24, 2006. (APPM/005699PC05).

(Continued)

*Primary Examiner*—Nadine Norton
*Assistant Examiner*—Maki Angadi
(74) *Attorney, Agent, or Firm*—Patterson & Sheridan

(57) ABSTRACT

Compositions and methods for processing a substrate having a conductive material layer disposed thereon are provided. In one embodiment, a composition for processing a substrate having a conductive material layer disposed thereon is provided which composition includes an acid based electrolyte, a chelating agent, a corrosion inhibitor, a passivating polymeric material, a pH adjusting agent, a solvent, and a pH between about 3 and about 10. The composition is used in a method to form a passivation layer on the conductive material layer, abrading the passivation layer to expose a portion of the conductive material layer, applying a bias to the substrate, and removing the conductive material layer.

20 Claims, 8 Drawing Sheets

U.S. PATENT DOCUMENTS

| | | |
|---|---|---|
| 3,239,441 A | 3/1966 | Marosi |
| 3,873,512 A | 3/1975 | Latanision |
| 4,263,113 A | 4/1981 | Bernard |
| 4,663,005 A | 5/1987 | Edson |
| 4,666,683 A | 5/1987 | Brown et al. |
| 4,793,895 A | 12/1988 | Kaanta et al. |
| 4,934,102 A | 6/1990 | Leach et al. |
| 4,992,135 A | 2/1991 | Doan |
| 5,002,645 A | 3/1991 | Eastland et al. |
| 5,096,550 A | 3/1992 | Mayer et al. |
| 5,114,548 A | 5/1992 | Rhoades |
| 5,129,981 A | 7/1992 | Wang et al. |
| 5,209,816 A | 5/1993 | Yu et al. |
| 5,217,586 A | 6/1993 | Datta et al. |
| 5,225,034 A | 7/1993 | Yu et al. |
| 5,256,565 A | 10/1993 | Bernhardt et al. |
| 5,340,370 A | 8/1994 | Cadien et al. |
| 5,391,258 A | 2/1995 | Branacaleoni et al. |
| 5,407,526 A | 4/1995 | Danielson et al. |
| 5,534,106 A | 7/1996 | Cote et al. |
| 5,543,032 A | 8/1996 | Datta et al. |
| 5,567,300 A | 10/1996 | Datta et al. |
| 5,575,706 A | 11/1996 | Tsai et al. |
| 5,770,095 A | 6/1998 | Sasaki et al. |
| 5,783,489 A | 7/1998 | Kaufman et al. |
| 5,800,577 A | 9/1998 | Kido |
| 5,804,507 A | 9/1998 | Tolles et al. |
| 5,807,165 A | 9/1998 | Uzoh et al. |
| 5,843,032 A | 12/1998 | Kastenhofer |
| 5,846,882 A | 12/1998 | Birang |
| 5,866,031 A | 2/1999 | Carprio et al. |
| 5,880,003 A | 3/1999 | Hayashi |
| 5,897,375 A | 4/1999 | Watts et al. |
| 5,911,619 A | 6/1999 | Uzoh et al. |
| 5,954,997 A | 9/1999 | Kaufman et al. |
| 5,965,036 A | 10/1999 | Maki et al. |
| 6,001,730 A | 12/1999 | Farkas et al. |
| 6,004,880 A | 12/1999 | Liu et al. |
| 6,027,669 A | 2/2000 | Miura et al. |
| 6,056,864 A | 5/2000 | Cheung |
| 6,063,306 A | 5/2000 | Kaufman et al. |
| 6,066,030 A | 5/2000 | Uzoh |
| 6,068,879 A | 5/2000 | Pasch |
| 6,077,412 A | 6/2000 | Ting et al. |
| 6,083,840 A | 7/2000 | Mravic et al. |
| 6,090,239 A | 7/2000 | Liu et al. |
| 6,096,652 A | 8/2000 | Watts et al. |
| 6,099,604 A | 8/2000 | Sandhu et al. |
| 6,103,096 A | 8/2000 | Datta et al. |
| 6,106,728 A | 8/2000 | Iida et al. |
| 6,117,775 A | 9/2000 | Kondo et al. |
| 6,117,783 A | 9/2000 | Small et al. |
| 6,117,853 A | 9/2000 | Sakai et al. |
| 6,121,152 A | 9/2000 | Adams et al. |
| 6,126,798 A | 10/2000 | Reid et al. |
| 6,126,853 A | 10/2000 | Kaufman et al. |
| 6,139,763 A | 10/2000 | Ina et al. |
| 6,143,155 A | 11/2000 | Adams et al. |
| 6,143,656 A | 11/2000 | Yang et al. |
| 6,153,043 A | 11/2000 | Edelstein et al. |
| 6,171,352 B1 | 1/2001 | Lee et al. |
| 6,176,992 B1 | 1/2001 | Talieh |
| 6,177,026 B1 | 1/2001 | Wang et al. |
| 6,190,237 B1 | 2/2001 | Huyng et al. |
| 6,194,317 B1 | 2/2001 | Kaisaki et al. |
| 6,206,756 B1 | 3/2001 | Chopra et al. |
| 6,217,416 B1 | 4/2001 | Kaufman et al. |
| 6,218,305 B1 | 4/2001 | Hosali et al. |
| 6,234,870 B1 | 5/2001 | Uzoh et al. |
| 6,238,592 B1 | 5/2001 | Hardy et al. |
| 6,248,222 B1 | 6/2001 | Wang |
| 6,258,711 B1 | 7/2001 | Laursen |
| 6,258,721 B1 | 7/2001 | Li et al. |
| 6,273,786 B1 | 8/2001 | Chopra et al. |
| 6,276,996 B1 | 8/2001 | Chopra |
| 6,280,598 B1 | 8/2001 | Barton et al. |
| 6,296,400 B1 | 10/2001 | Uchiyama et al. |
| 6,299,741 B1 | 10/2001 | Sun et al. |
| 6,303,049 B1 | 10/2001 | Lee et al. |
| 6,303,551 B1 | 10/2001 | Li et al. |
| 6,310,019 B1 | 10/2001 | Kakizawa et al. |
| 6,315,803 B1 | 11/2001 | Ina et al. |
| 6,315,883 B1 | 11/2001 | Mayer et al. |
| 6,348,076 B1 | 2/2002 | Canaperi et al. |
| 6,354,916 B1 | 3/2002 | Uzoh et al. |
| 6,355,075 B1 | 3/2002 | Ina et al. |
| 6,355,153 B1 | 3/2002 | Uzoh et al. |
| 6,361,422 B1 | 3/2002 | Ettinger et al. |
| 6,375,693 B1 | 4/2002 | Cote et al. |
| 6,379,223 B1 | 4/2002 | Sun et al. |
| 6,391,166 B1 | 5/2002 | Wang |
| 6,395,152 B1 | 5/2002 | Wang |
| 6,416,685 B1 | 7/2002 | Zhang et al. |
| 6,419,554 B2 | 7/2002 | Chopra et al. |
| 6,428,721 B1 | 8/2002 | Ina et al. |
| 6,429,133 B1 | 8/2002 | Chopra |
| 6,440,186 B1 | 8/2002 | Sakai et al. |
| 6,440,295 B1 | 8/2002 | Wang |
| 6,447,371 B2 | 9/2002 | Kaufman et al. |
| 6,454,819 B1 | 9/2002 | Yano et al. |
| 6,455,479 B1 * | 9/2002 | Sahbari ............... 510/175 |
| 6,508,952 B1 * | 1/2003 | Lee et al. ............... 252/79.1 |
| 6,524,168 B2 * | 2/2003 | Luo et al. ............... 451/41 |
| 6,541,384 B1 | 4/2003 | Lizhong et al. |
| 6,551,935 B1 * | 4/2003 | Sinha et al. ............... 438/693 |
| 6,555,158 B1 | 4/2003 | Yoshio et al. |
| 6,562,719 B2 | 5/2003 | Kondo et al. |
| 6,565,619 B1 | 5/2003 | Asano et al. |
| 6,568,997 B2 | 5/2003 | Costas et al. |
| 6,569,349 B1 | 5/2003 | Wang et al. |
| 6,579,153 B2 | 6/2003 | Uchikura et al. |
| 6,592,742 B2 | 7/2003 | Sun et al. |
| 6,593,239 B2 | 7/2003 | Kaufman et al. |
| 6,596,638 B1 | 7/2003 | Kondo et al. |
| 6,602,112 B2 | 8/2003 | Tran et al. |
| 6,605,537 B2 | 8/2003 | Bian et al. |
| 6,613,200 B2 | 9/2003 | Li et al. |
| 6,616,976 B2 | 9/2003 | Montano et al. |
| 6,620,215 B2 | 9/2003 | Li et al. |
| 6,653,242 B1 | 11/2003 | Sun et al. |
| 6,676,484 B2 | 1/2004 | Chopra |
| 6,679,928 B2 | 1/2004 | Costas et al. |
| 6,679,929 B2 | 1/2004 | Asano et al. |
| 6,693,036 B1 | 2/2004 | Nogami et al. |
| 6,811,680 B2 | 11/2004 | Chen et al. |
| 6,821,881 B2 | 11/2004 | Tsai et al. |
| 6,837,983 B2 | 1/2005 | Duboust et al. |
| 6,893,476 B2 | 5/2005 | Siddiqui et al. |
| 6,899,804 B2 | 5/2005 | Duboust et al. |
| 2001/0016469 A1 | 8/2001 | Chopra |
| 2001/0024878 A1 | 9/2001 | Nakamura |
| 2001/0036746 A1 | 11/2001 | Sato et al. |
| 2001/0042690 A1 | 11/2001 | Talieh |
| 2001/0052351 A1 | 12/2001 | Brown et al. |
| 2002/0008036 A1 | 1/2002 | Wang |
| 2002/0016064 A1 | 2/2002 | Komai et al. |
| 2002/0016073 A1 | 2/2002 | Kondo et al. |
| 2002/0016272 A1 | 2/2002 | Kakizawa et al. |
| 2002/0040100 A1 | 4/2002 | Kume et al. |
| 2002/0070126 A1 | 6/2002 | Sato et al. |
| 2002/0072309 A1 | 6/2002 | Sato et al. |
| 2002/0074230 A1 | 6/2002 | Basol |
| 2002/0088709 A1 | 7/2002 | Hongo et al. |
| 2002/0096659 A1 | 7/2002 | Sakai et al. |

| | | |
|---|---|---|
| 2002/0104764 A1 | 8/2002 | Gautum et al. |
| 2002/0108861 A1 | 8/2002 | Emesh et al. |
| 2002/0119286 A1 | 8/2002 | Chen et al. |
| 2002/0130049 A1 | 9/2002 | Chen et al. |
| 2002/0139055 A1 | 10/2002 | Asano et al. |
| 2002/0160698 A1 | 10/2002 | Sato et al. |
| 2002/0182982 A1 | 12/2002 | Jui-Lung et al. |
| 2003/0019755 A1 | 1/2003 | Hey et al. |
| 2003/0073311 A1 | 4/2003 | Joseph et al. |
| 2003/0073386 A1 | 4/2003 | Ma et al. |
| 2003/0079416 A1 | 5/2003 | Ma et al. |
| 2003/0083214 A1 | 5/2003 | Kakizawa et al. |
| 2003/0104762 A1* | 6/2003 | Sato et al. ............. 451/9 |
| 2003/0113996 A1 | 6/2003 | Nogami et al. |
| 2003/0114004 A1 | 6/2003 | Sato et al. |
| 2003/0115475 A1 | 6/2003 | Russo et al. |
| 2003/0116445 A1 | 6/2003 | Sun et al. |
| 2003/0116446 A1 | 6/2003 | Duboust et al. |
| 2003/0136055 A1 | 7/2003 | Li et al. |
| 2003/0153184 A1 | 8/2003 | Wang et al. |
| 2003/0170091 A1 | 9/2003 | Shomler et al. |
| 2003/0178320 A1 | 9/2003 | Liu et al. |
| 2003/0216045 A1 | 11/2003 | Wang et al. |
| 2003/0234184 A1 | 12/2003 | Liu et al. |
| 2004/0053499 A1 | 3/2004 | Liu et al. |
| 2004/0144038 A1 | 7/2004 | Siddiqui |
| 2004/0248412 A1 | 12/2004 | Liu et al. |
| 2005/0044803 A1 | 3/2005 | Siddiqui et al. |
| 2005/0565378 | 3/2005 | Chen et al. |
| 2005/0076578 A1 | 4/2005 | Siddiqui et al. |
| 2005/0076579 A1 | 4/2005 | Siddiqui et al. |
| 2005/0079718 A1 | 4/2005 | Siddiqui et al. |
| 2005/0079803 A1 | 4/2005 | Siddiqui et al. |
| 2005/0218010 A1 | 10/2005 | Wang et al. |

FOREIGN PATENT DOCUMENTS

| | | |
|---|---|---|
| EP | 0 699 782 | 3/1996 |
| EP | 0 811 665 | 12/1997 |
| EP | 0 846 742 | 6/1998 |
| EP | 1 103 346 | 5/2001 |
| EP | 1 167 585 | 1/2002 |
| EP | 1 170 761 | 9/2002 |
| JP | 56-069070 | 10/1981 |
| JP | 58-093886 | 6/1983 |
| JP | 58-093899 | 6/1983 |
| JP | 62-208823 | 9/1987 |
| JP | 62-224523 | 10/1987 |
| JP | 05 302199 | 11/1993 |
| JP | 06-079533 | 3/1994 |
| JP | 06 158397 | 6/1994 |
| JP | 07-316899 | 5/1995 |
| JP | 07-288253 | 10/1995 |
| JP | 07-312366 | 11/1995 |
| JP | 09-207029 | 8/1997 |
| JP | 10 121297 | 5/1998 |
| JP | 10-270412 | 10/1998 |
| JP | 11-277339 | 10/1999 |
| JP | 2000 192298 | 7/2000 |
| JP | 2000 256898 | 9/2000 |
| JP | 01-77117 | 3/2001 |
| SU | 1 618 538 | 1/1991 |
| WO | WO 98/04646 | 2/1998 |
| WO | WO 98/49723 | 11/1998 |
| WO | WO 99/46081 | 9/1999 |
| WO | WO 99/46353 | 9/1999 |
| WO | WO 99/53532 | 10/1999 |
| WO | WO 99/65072 | 12/1999 |
| WO | 03426 | 1/2000 |
| WO | WO 00/03426 | 1/2000 |
| WO | WO 00/26443 | 5/2000 |
| WO | WO 00/55876 | 9/2000 |
| WO | WO 01/77241 | 10/2001 |
| WO | WO 02/23616 | 3/2002 |
| WO | WO 02/075804 | 9/2002 |
| WO | WO 02/088229 | 11/2002 |
| WO | WO 03/060962 | 7/2003 |
| WO | WO 03/072672 | 9/2003 |

OTHER PUBLICATIONS

Besser et al., "Mechanical Strain Evolution in Cu/low K Interconnect Lines", *Mat. Res. Soc. Symp. Proc.* vol. 795, 2004 Materials Research Society, pp. U1.1.1-U1.1.6.

Chandrasekaran, et al., "Effects of CMP Process Conditions on Defect Generation in Low- k Materials", *Journal of the Electrochemical Society*,pp. G882-G889 (2004).

Chang, et al., "Microleveling Mechanisms and Applications of Electropolishing of Planarization of Copper Mettalization", *J. Vac. Sci. Technol. B* 20(5), Sep./Oct. 2002, pp. 2149-2152.

Chang, et al., "Superpolishing of Planarizing Copper Damascene Interconnects", *Electrochemical and Solid-State Letters*, pp. G72-G74 (2003).

Contolini, et al., "Electrochemical Planarization for Multilevel Metallization", *J. Electrochem. Soc.*, vol. 141, No. 9, Sep. 1994, pp. 2503-2510.

Deshpande, et al., "Chemical Mechanical Planarization of Copper: Role of Oxidants and Inhibitors", *Journal of the Electrochemical Society*, pp. G788-G794 (2004).

Du, et al., "Effect of Hydrogen Peroxide on Oxidation of Copper in CMP Slurries Containing Glycine and Cu Ions", *Electrochimica Acta*, pp. 4505-4512 (2004).

Du, et al., Mechanism of Copper Removal During CMP in Acidic H202 Slurry, *Journal of The Electrochemical Society*, pp. G230-235 (2004).

Economikos, et al., "Integrated Electro-Chemical Mechanical Planarization (Ecmp) for Future Generation Device Technology", 2004 IEEE, pp. 233-235.

Goonetilleke, et al., Voltage-Induced Material Removal for Electrochemical Mechanical Planarization of Copper in Electrolytes Containing NO -3, Glycine, and H202, *Electrochemical and Solid-State Letters*, pp. G190-G193 (2005).

Hu, et al. "Copper Interconnection Integration and Reliability", *Thin Solid State Films*, pp. 84-92, (1995).

Jin-Hua, et al., "An XPS and BAW Sensor Study of the Structure and Real-Time Growth Behaviours of a Complex Surface Film on Copper in Sodium Chloride Solutions (pH=9), Containing a Low Concentration of Benzotriazole", *Eletrochimica Acta*, vol. 43, Nos. 3-4, pp. 265-274, 1998.

Kaufman, et al., "Chemical-Mechanical Polishing for Fabricating Patterned W Metal Features as Chip Interconnects", *J. Electrochem. Soc.*, vol. 138, No. 11, Nov. 1991; The Electrochemical Society, Inc. pp. 3460-3465.

Kondo, et al., "Role of Additives for Copper Damascene Electrodeposition: Experimental Study on Inhibition and Acceleration Effects", *Journal of the Electrochemical Society*, pp. C250-C255 (2004).

Mansikkamaki, et al., "Inhibitive Effect of Benzotriazole on Copper Surfaces Studied by SECM", *Journal of the Electrochemical Society*, pp. B12-B16 (2005).

Padhi, et al., "Planarization of Copper Thin Films by Electropolishing in Phosphoric Acid for ULSI Applications", *Journal of the Electrochemical Society*, 150, pp. G10-G14 (2003).

Qafsaoui, et al., "Quantitative Characterization of Protective Films Grown on Copper in the Presence of Different Triazole Derivative Inhibitors", *Electrochimica Acta* 47 (2002), pp. 4339-4346.

Steigerwald, et al., "Effect of Copper Ions in the Slurry on the Chemical-Mechanical Polish Rate of Titanium", *J. Electrochem. Soc.*, vol. 141, No. 12, Dec. 1994, pp. 3512-3516.

Tamilmani, et al., "Potential-pH Diagrams of Interest to Chemical Mechanical Planarization of Copper", *Journal of The Electrochemical Society*, V. 149, pp. G638-G642 (2002).

Tromans, et al., "Growth of Passivating CuBTA Films on Copper in Aqueous Chloride/Benzotriazole Solutions", *Electrochemical and Solid-State Letter*, V. 5, pp. B5-B8 (2002).

Wang, et al., "Inhibition Effect of AC-Treated, Mixed Self-Assembled Film of Phenylthiourea and 1-Dodecanethiol on Copper Corrosion", *Journal of the Electrochemical Society*, pp. B11-B15 (2004).

First Official Letter dated May 26, 2006 for Chinese National Application No. 03807940.2. (APPM/005699CN02).

Translation of First Official Letter dated May 26, 2006 for Chinese National Application No. 03807940.2. (APPM/005699CN02).

D. Landolt, "Fundamental Aspects of Electropolishing", Mar. 18, 1996, pp. 1-11.

International Search Report for PCT/US02/04806 dated Apr. 1, 2003. (AMAT/5699PC).

International Search Report for PCT/US02/40754 dated Aug. 5, 2003. (AMAT/5998PC).

Nogami,"*An Innovation to Integrate Porous Low-K Materials and Copper*", *InterConnect Japan 2001*; Honeywell Seminar (Dec. 6, 2001) pp. 1-12.

Partial International Search Report for PCT/US02/40754 dated Apr. 28, 2003. (AMAT/5998PC).

PCT International Preliminary Examination Report for PCT/US02/04806, dated Sep. 7, 2004. (AMAT/5699.PC).

PCT International Preliminary Examination Report for PCT/US03/06058, dated Sep. 7, 2004. (AMAT/5699.PC.02).

PCT International Search Report for PCT/US04/17691, dated Nov. 16, 2004. (AMAT/5699.PC.02).

PCT International Search Report for PCT/US03/06058 dated Jun. 25, 2003. AMAT/5699.PC02).

PCT Written Opinion for PCT/US03/06058, dated Feb. 13, 2004. (AMAT/5699.PC02).

PCT Written Opinion for PCT/US04/17691, dated Nov. 16, 2004. (AMAT/5699.PC03).

PCT Written Opinion for PCT/US02/04806, dated Mar. 9, 2004. (AMAT/5699.PC).

Robert J. Contolini, "Electrochemical Planarization of ULSI Copper" Jun. 1997, Solid State Technology, pp. 155-156, 158, 160.

PCT International Search Report and Written Opinion dated Nov. 15, 2007 for International Application No. PCT/ US2006/40123. (APPM/5699.PCT07).

Japanese Office Action dated Dec. 4, 2007 for Application No. P2002-574121. (APPM/005699 JP).

Notice to File a Response dated Jan. 31, 2008 for Korean Patent Application No. 10-2003-7009383. (APPM/005699.P5).

Office Action dated Jun. 26, 2008 for Japanese Patent Application No. P2002-574121. (APPM/005699-JP).

* cited by examiner

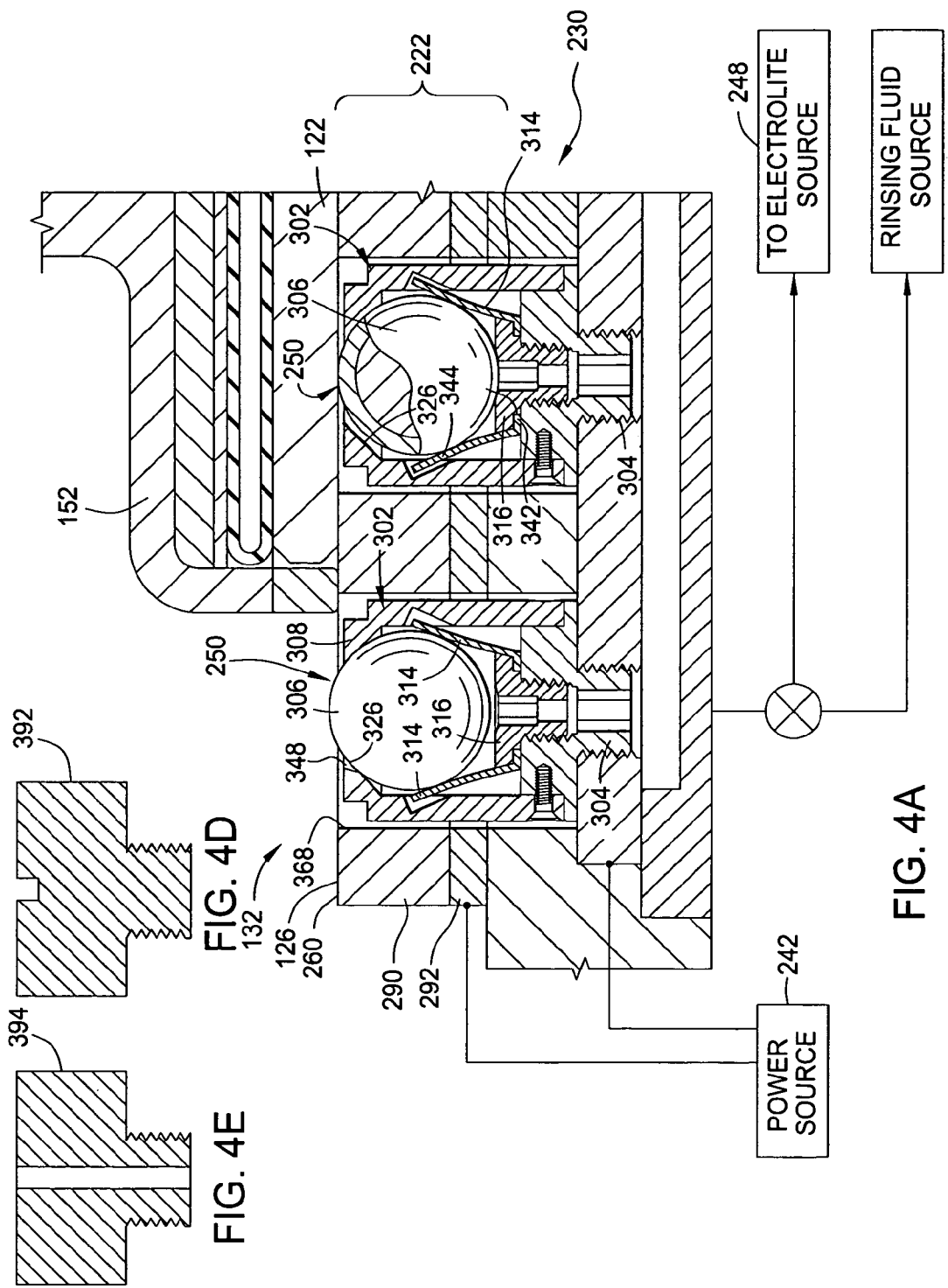

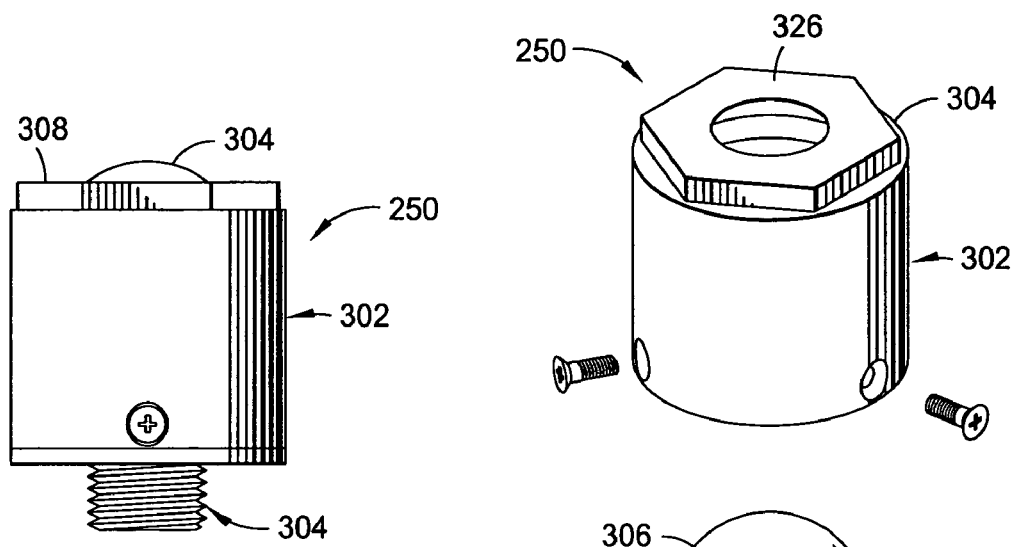
FIG. 5A
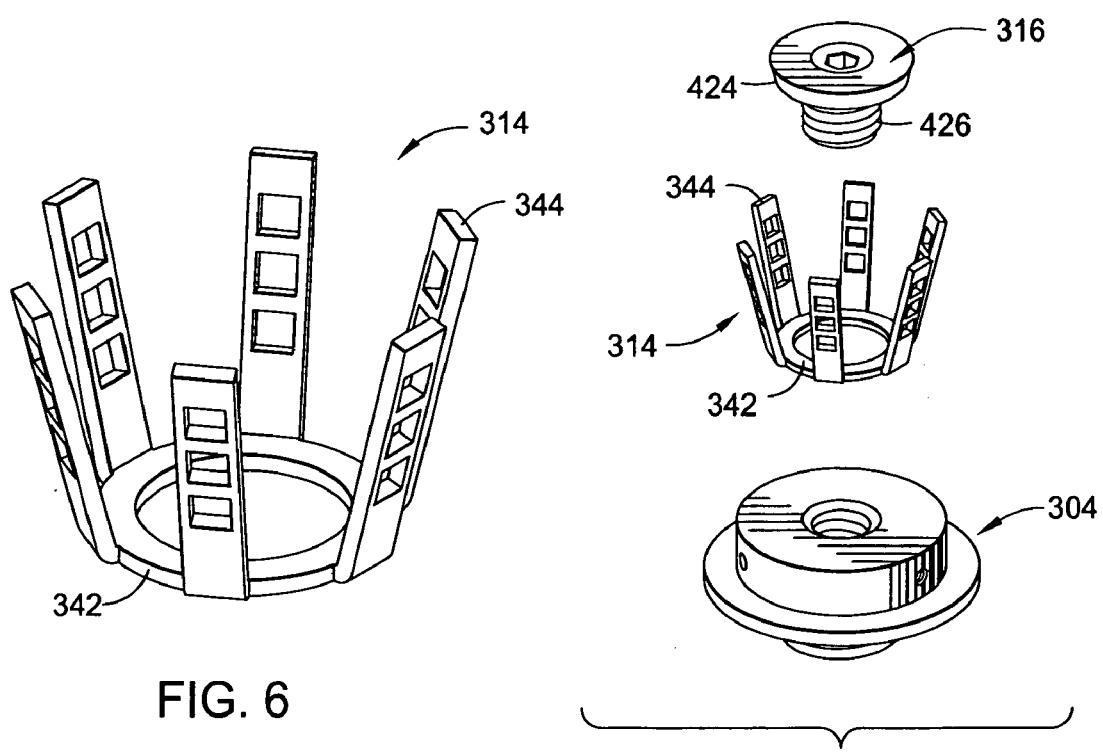
FIG. 6
FIG. 5B

PROCESS AND COMPOSITION FOR CONDUCTIVE MATERIAL REMOVAL BY ELECTROCHEMICAL MECHANICAL POLISHING

CROSS-REFERENCE TO RELATED APPLICATIONS

This application is a continuation-in-part U.S. patent application Ser. No. 10/845,754, filed May 14, 2004, which application is a continuation-in-part of U.S. patent application Ser. No. 10/608,404, filed Jun. 26, 2003, which application is a continuation-in-part of U.S. patent application Ser. No. 10/456,220, filed Jun. 6, 2003, which application is a continuation-in-part U.S. patent application Ser. No. 10/378,097, filed Feb. 26, 2003, now U.S. Pat. No. 7,128,825 which application claims priority to the U.S. Provisional Patent Application Ser. No. 60/359,746, filed on Feb. 26, 2002, and which application is a continuation-in-part of U.S. patent application Ser. No. 10/038,066, filed Jan. 3, 2002, now U.S. Pat. No. 6,811,680, issued on Nov. 2, 2004, which application claims priority to the U.S. Provisional Patent Application Ser. No. 60/275,874, filed on Mar. 14, 2001; and the application is a continuation-in-part U.S. patent application Ser. No. 11/074,274, filed Mar. 7, 2005, which application is a continuation application of U.S. patent application Ser. No. 10/141,459, filed May 7, 2002, now U.S. Pat. No. 6,863,797, issued on Mar. 8, 2005, which application is a continuation-in-part of U.S. patent application Ser. No. 10/032,275, filed Dec. 21, 2001 now U.S. Pat. No. 6,899,804; and each application is herein incorporated by reference.

BACKGROUND OF THE INVENTION

1. Field of the Invention

Embodiments of the present invention relate to compositions and methods for removing a conductive material from a substrate.

2. Background of the Related Art

Reliably producing sub-half micron and smaller features is one of the key technologies for the next generation of very large scale integration (VLSI) and ultra large-scale integration (ULSI) of semiconductor devices. However, as the limits of circuit technology are pushed, the shrinking dimensions of interconnects in VLSI and ULSI technology have placed additional demands on processing capabilities. Reliable formation of interconnects is important to VLSI and ULSI success and to the continued effort to increase circuit density and quality of individual substrates and die.

Multilevel interconnects are formed using sequential material deposition and material removal techniques on a substrate surface to form features therein. As layers of materials are sequentially deposited and removed, the uppermost surface of the substrate may become non-planar across its surface and require planarization prior to further processing. Planarization or "polishing" is a process in which material is removed from the surface of the substrate to form a generally even, planar surface. Planarization is useful in removing excess deposited material, removing undesired surface topography, and surface defects, such as surface roughness, agglomerated materials, crystal lattice damage, scratches, and contaminated layers or materials to provide an even surface for subsequent photolithography and other semiconductor manufacturing processes. One conventional process for planarization is by chemical mechanical polishing (CMP), which planarizes a layer by chemical activity and mechanical activity, It is extremely difficult to planarize a metal surface, particularly a copper surface, as of a damascene inlay as shown in FIGS. 1A and 1B, with a high degree of surface planarity using a chemical mechanical polishing process. A damascene inlay formation process may include etching feature definitions in an interlayer dielectric, such as a silicon oxide layer, sometimes including a barrier layer in the feature definition and on a surface of the substrate, and depositing a thick layer of copper material on the substrate surface and any barrier layer if present. Chemical mechanically polishing the copper material to remove excess copper above the substrate surface often insufficiently planarizes the copper surface. Chemical mechanical polishing techniques to completely remove the copper material often results in topographical defects, such as dishing and erosion that may affect subsequent processing of the substrate.

Dishing occurs when a portion of the surface of the inlaid metal of the interconnection formed in the feature definitions in the interlayer dielectric is excessively polished, resulting in one or more concave depressions, which may be referred to as concavities or recesses. Referring to FIG. 1A, a damascene inlay of lines 11 are formed by depositing copper (Cu) or a copper alloy, in a damascene opening formed in interlayer dielectric 10, for example, silicon dioxide. While not shown, a barrier layer of a suitable material such as titanium (or tantalum) and/or titanium nitride (or tantalum nitride) for copper may be deposited between the interlayer dielectric 10 and the inlaid metal 12. Subsequent to planarization, a portion of the inlaid metal 12 may be depressed by an amount D, referred to as the amount of dishing. Dishing is more likely to occur in wider or less dense features on a substrate surface.

Additionally, residual material may remain after a polishing process. In such instances a second polishing step or an overpolishing process may be performed to remove the remaining material. However, such processes may result in erosion, characterized by excessive polishing of the layer not targeted for removal, such as a dielectric layer surrounding a metal feature. Referring to FIG. 1 B, a copper line 21 and dense array of copper lines 22 are inlaid in interlayer dielectric 20. The process to polish the copper lines 22 may result in loss, or erosion E, of the dielectric 20 between the metal lines 22. Erosion is observed to occur near narrower or more dense features formed in the substrate surface. Modifying conventional copper CMP polishing techniques has resulted in less than desirable polishing rates and less than desirable polishing results than commercially acceptable.

Therefore, there is a need for compositions and methods for removing conductive material, such as excess copper material, from a substrate that minimizes the formation of topographical defects to the substrate during planarization.

SUMMARY OF THE INVENTION

In one embodiment, a composition for processing a substrate having a conductive material layer disposed thereon is provided which composition includes an acid based electrolyte, a chelating agent, a corrosion inhibitor, a passivating polymeric material, a pH adjusting agent, a solvent, and a pH between about 3 and about 10.

In another embodiment, a method of processing a substrate having a conductive material layer disposed thereon is provided which includes disposing a substrate having a conductive material layer formed thereon in a process apparatus comprising a first electrode and a second electrode, wherein the substrate is in electrical contact with the second electrode, providing a polishing composition between the first electrode and the substrate, wherein the polishing composition comprises an acid based electrolyte, a chelating agent, a corrosion inhibitor, a passivating polymeric material, a pH adjusting agent, a solvent, and a pH between about 3 and about 10, contacting the substrate to a polishing article, providing relative motion between the substrate and the polishing article, applying a bias between the first electrode and the second electrode, and removing conductive material from the substrate surface.

In another embodiment, a method of removing a conductive material layer is provided which includes providing the substrate to a process apparatus; exposing the substrate to a first polishing composition, contacting the substrate to a polishing article, providing relative motion between the substrate and the polishing article, applying a first bias to the substrate, removing at least 50% of the conductive material layer, exposing the substrate to a second polishing composition comprising an acid based electrolyte, a chelating agent, a corrosion inhibitor, a passivating polymeric material, a pH adjusting agent, a pH between about 3 and about 10, and a solvent, contacting the substrate to the polishing article, providing relative motion between the substrate and the polishing article, applying a second bias to the substrate, and removing the conductive layer.

BRIEF DESCRIPTION OF THE DRAWINGS

So that the manner in which the above recited aspects of the present invention are attained and can be understood in detail, a more particular description of embodiments of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 4A is a partial sectional view of the first ECMP station through two contact assemblies;

FIGS. 4D-E are sectional views of plugs;

FIGS. 5A and 5B are side, exploded and sectional views of one embodiment of a contact assembly;

FIG. 6 is one embodiment of a contact element;

DETAILED DESCRIPTION OF THE PREFERRED EMBODIMENT

Figure 1A:
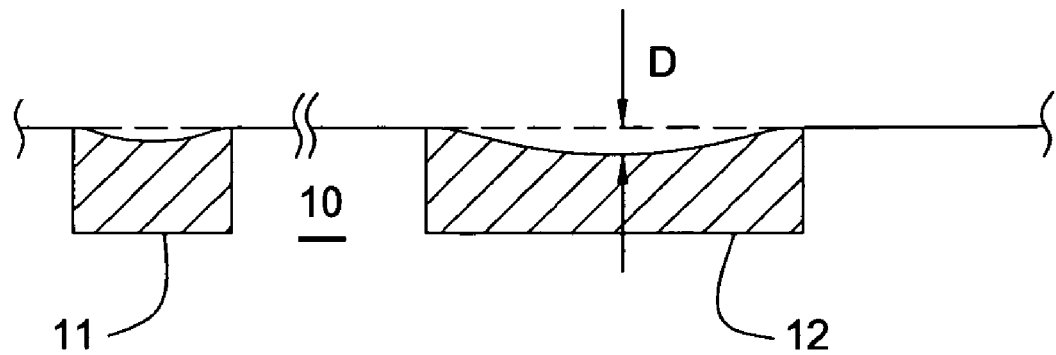
FIGS. 1A and 1B schematically illustrate the phenomenon of dishing and erosion respectively.

In general, aspects of the inventions provide compositions and methods for removing at least a conductive material from a substrate surface. The inventions are described below in reference to a planarizing process for the removal of conductive materials from a substrate surface by an electrochemical mechanical polishing (ECMP) technique.

The words and phrases used herein should be given their ordinary and customary meaning in the art by one skilled in the art unless otherwise further defined. Chemical mechanical polishing should be broadly construed and includes, but is not limited to, planarizing a substrate surface using chemical activity and mechanical activity, or a concurrent application of chemical activity and mechanical activity. Electropolishing should be broadly construed and includes, but is not limited to, removing material from a substrate by eroding the substrate surface under application of electric current. Electrochemical mechanical polishing (ECMP) should be broadly construed and includes, but is not limited to, planarizing a substrate by the application of electrochemical activity, mechanical activity, chemical activity, or a concurrent application of a combination of electrochemical, chemical, and/or mechanical activity to remove material from a substrate surface.

Anodic dissolution should be broadly construed and includes, but is not limited to, the application of an anodic bias to a substrate directly or indirectly which results in the removal of conductive material from a substrate surface and into a surrounding polishing composition. Polishing composition should be broadly construed and includes, but is not limited to, a composition that provides ionic conductivity, and thus, electrical conductivity, in a liquid medium, which generally comprises materials known as electrolyte components. The amount of each component in the polishing compositions can be measured in volume percent or weight percent. Volume percent refers to a percentage based on volume of a desired liquid component divided by the total volume of all of the liquid in the complete composition. A percentage based on weight percent is the weight of the desired component divided by the total weight of all of the liquid components in the complete composition. Abrading and abrasion should be broadly construed and includes, but is not limited to, contacting a material and displacing, disturbing, or removing all or a portion of the material.

The electrochemical mechanical polishing process may be performed in a process apparatus, such as a platform having one or more polishing stations adapted for electrochemical mechanical polishing processes. A platen for performing an electrochemical mechanical polishing process may include a polishing article, a first electrode, and a second electrode, wherein the substrate is in electrical contact with the second electrode. A first electrochemical mechanical polishing process may be performed on a first platen as described herein and the second electrochemical mechanical polishing process may be performed on the same or different platen adapted for electrochemical mechanical polishing, such as the second platen as described herein.

Apparatus

Figure 2:
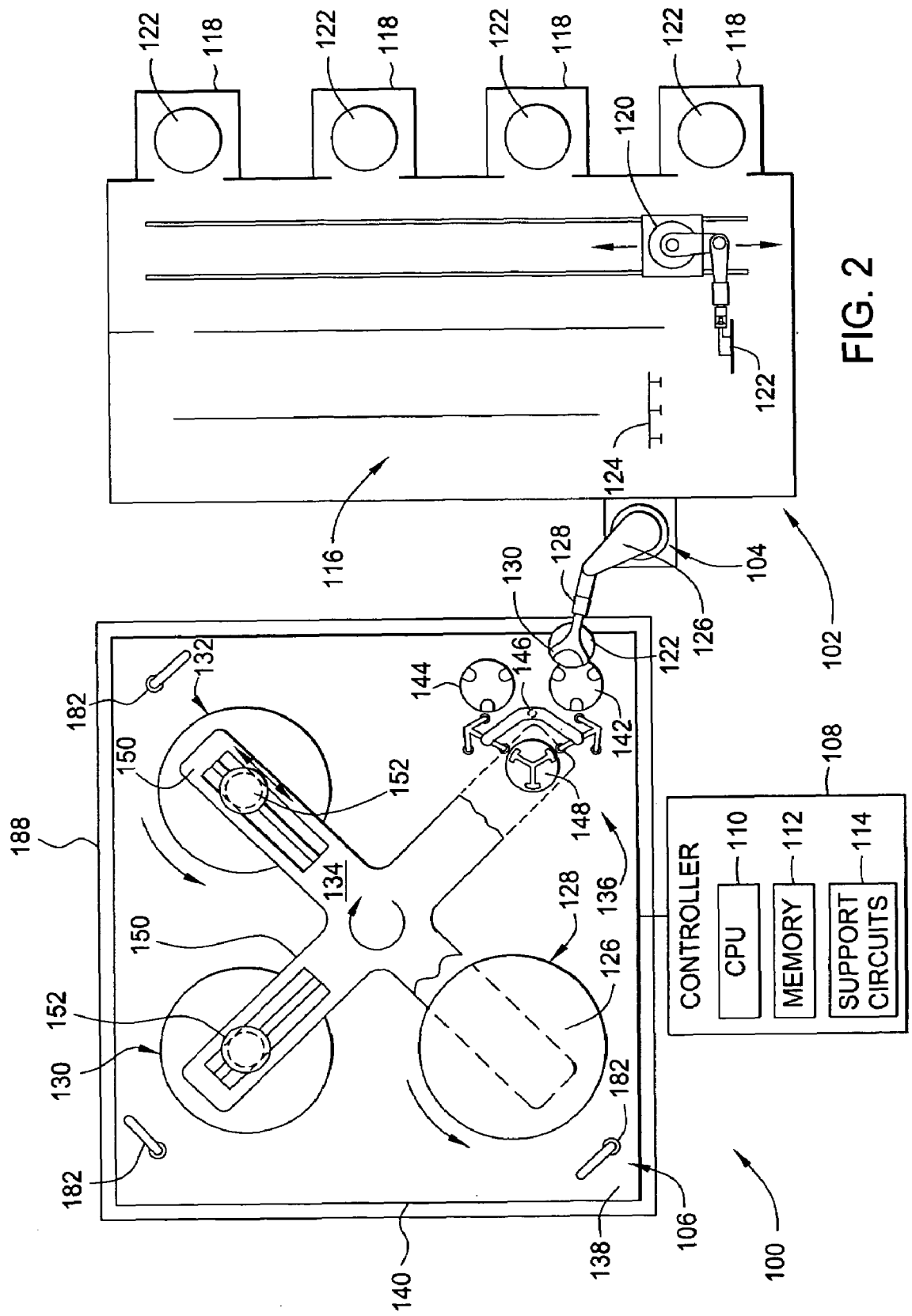
FIG. 2 is a plan view of an electrochemical mechanical planarizing system.

FIG. 2 is a plan view of one embodiment of a planarization system 100 having an apparatus for electrochemically processing a substrate. The exemplary system 100 generally comprises a factory interface 102, a loading robot 104, and a planarizing module 106. The loading robot 104 is disposed proximate the factory interface 102 and the planarizing module 106 to facilitate the transfer of substrates 122 therebetween.

A controller 108 is provided to facilitate control and integration of the modules of the system 100. The controller 108 comprises a central processing unit (CPU) 110, a memory 112, and support circuits 114. The controller 108 is coupled to the various components of the system 100 to facilitate control of, for example, the planarizing, cleaning, and transfer processes.

The factory interface 102 generally includes a cleaning module 116 and one or more wafer cassettes 118. An interface robot 120 is employed to transfer substrates 122 between the wafer cassettes 118, the cleaning module 116 and an input module 124. The input module 124 is positioned to facilitate transfer of substrates 122 between the planarizing module 106 and the factory interface 102 by grippers, for example vacuum grippers or mechanical clamps (not shown).

The planarizing module 106 includes at least a first electrochemical mechanical planarizing (ECMP) station 128, disposed in an environmentally controlled enclosure 188. Examples of planarizing modules 106 that can be adapted to benefit from the invention include MIRRA® Chemical Mechanical Planarizing Systems, MIRRA MESA™ Chemical Mechanical Planarizing Systems, REFLEXION® Chemical Mechanical Planarizing Systems, REFLEXION LK™ Chemical Mechanical Planarizing Systems, and REFLEXION LK ECMP™ Chemical Mechanical Planarizing Systems, all available from Applied Materials, Inc. of Santa Clara, Calif. Other planarizing modules, including those that use processing pads, planarizing webs, or a combination thereof, and those that move a substrate relative to a planarizing surface in a rotational, linear or other planar motion may also be adapted to benefit from the invention.

In the embodiment depicted in FIG. 2, the planarizing module 106 includes one bulk ECMP station 128, a second ECMP station 130 and one CMP station 132. Bulk removal of conductive material from the substrate is performed through an electrochemical dissolution process at the bulk ECMP station 128. After the bulk material removal at the bulk ECMP station 128, residual conductive material is removed from the substrate at the residual ECMP station 130 through a second electrochemical mechanical process. It is contemplated that more than one residual ECMP station 130 may be utilized in the planarizing module 106.

A conventional chemical mechanical planarizing process is performed at the planarizing station 132 after processing at the residual ECMP station 130 by the barrier removal process described herein. Alternatively, an example of a conventional CMP process on a chemical mechanical polishing station for the barrier removal is described in U.S. patent Application Ser. No. 10/187,857, filed Jun. 27, 2002, which is incorporated by reference in its entirety. It is contemplated that other CMP processes may be alternatively performed. As the CMP stations 132 are conventional in nature, further description thereof has been omitted for the sake of brevity.

It is contemplated that more than one ECMP station may be utilized to perform the multi-step removal process after the bulk removal process performed at a different station. Alternatively, each of the first and second ECMP stations 128, 130 may be utilized to perform both the bulk and multi-step conductive material removal on a single station. It is also contemplated that all ECMP stations (for example 3 stations of the module 106 depicted in FIG. 2) may be configured to process the conductive layer with a two step removal process.

The exemplary planarizing module 106 also includes a transfer station 136 and a carousel 134 that are disposed on an upper or first side 138 of a machine base 140. In one embodiment, the transfer station 136 includes an input buffer station 142, an output buffer station 144, a transfer robot 146, and a load cup assembly 148. The input buffer station 142 receives substrates from the factory interface 102 by means of the loading robot 104. The loading robot 104 is also utilized to return polished substrates from the output buffer station 144 to the factory interface 102. The transfer robot 146 is utilized to move substrates between the buffer stations 142, 144 and the load cup assembly 148.

In one embodiment, the transfer robot 146 includes two gripper assemblies (not shown), each having pneumatic gripper fingers that hold the substrate by the substrate's edge. The transfer robot 146 may simultaneously transfer a substrate to be processed from the input buffer station 142 to the load cup assembly 148 while transferring a processed substrate from the load cup assembly 148 to the output buffer station 144. An example of a transfer station that may be used to advantage is described in U.S. Pat. No. 6,156,124, issued Dec. 5, 2000 to Tobin, which is herein incorporated by reference in its entirety.

The carousel 134 is centrally disposed on the base 140. The carousel 134 typically includes a plurality of arms 150, each supporting a planarizing head assembly 152. Two of the arms 150 depicted in FIG. 2 are shown in phantom such that the transfer station 136 and a planarizing surface 126 of the first ECMP station 128 may be seen. The carousel 134 is indexable such that the planarizing head assemblies 152 may be moved between the planarizing stations 128, 130, 132 and the transfer station 136. One carousel that may be utilized to advantage is described in U.S. Pat. No. 5,804,507, issued Sep. 8, 1998 to Perlov, et al., which is hereby incorporated by reference in its entirety.

A conditioning device 182 is disposed on the base 140 adjacent each of the planarizing stations 128, 130, 132. The conditioning device 182 periodically conditions the planarizing material disposed in the stations 128, 130, 132 to maintain uniform planarizing results.

Figure 3:
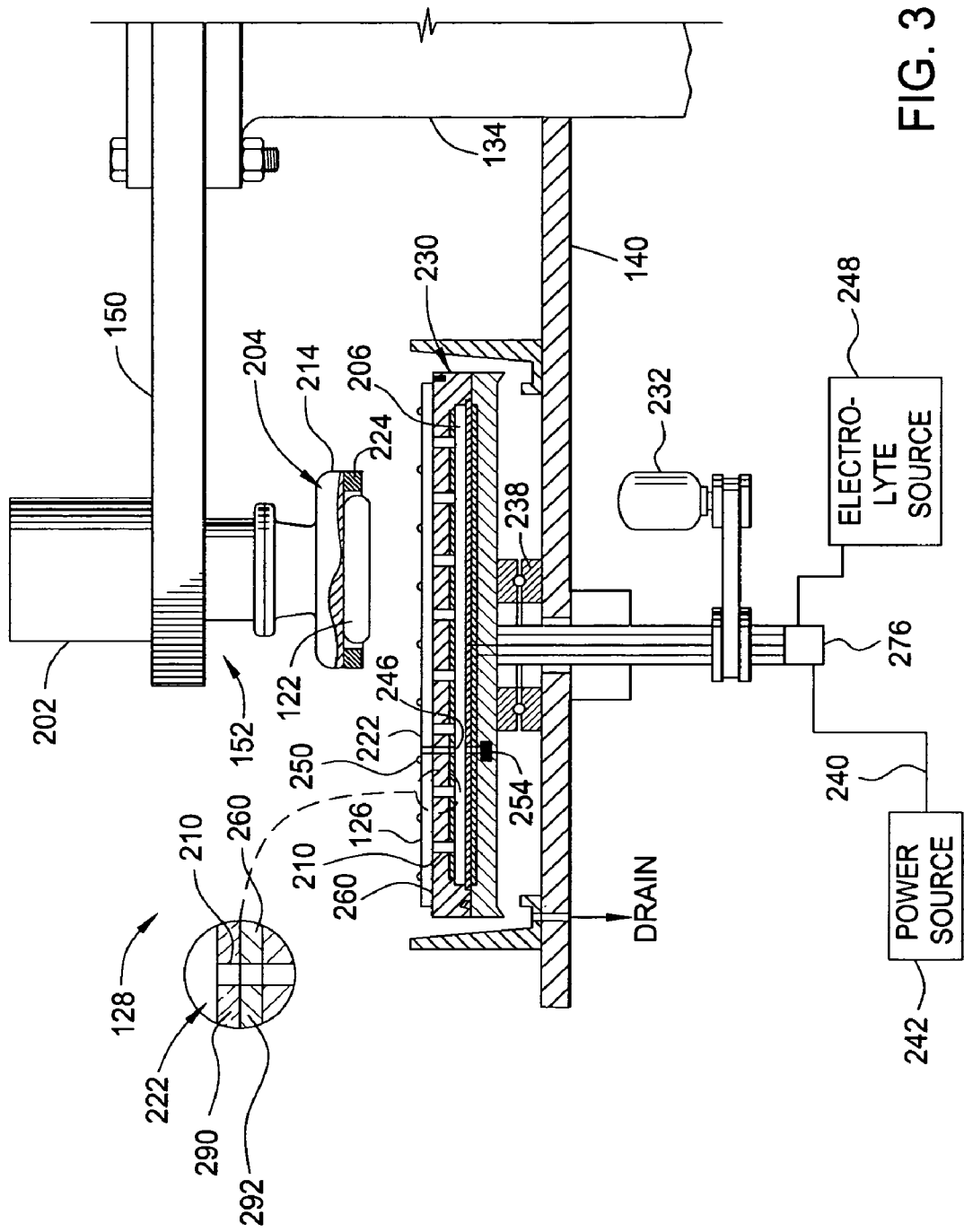
FIG. 3 is a sectional view of one embodiment of a first electrochemical mechanical planarizing (ECMP) station of the system of FIG. 2.

FIG. 3 depicts a sectional view of one of the planarizing head assemblies 152 positioned over one embodiment of the bulk ECMP station 128. The planarizing head assembly 152 generally comprises a drive system 202 coupled to a planarizing head 204. The drive system 202 generally provides at least rotational motion to the planarizing head 204. The planarizing head 204 additionally may be actuated toward the bulk ECMP station 128 such that the substrate 122 retained in the planarizing head 204 may be disposed against the planarizing surface 126 of the bulk ECMP station 128 during processing. The drive system 202 is coupled to the controller 108 that provides a signal to the drive system 202 for controlling the rotational speed and direction of the planarizing head 204.

In one embodiment, the planarizing head may be a TITAN HEAD™ or TITAN PROFILER™ wafer carrier manufactured by Applied Materials, Inc. Generally, the planarizing head 204 comprises a housing 214 and retaining ring 224 that defines a center recess in which the substrate 122 is retained. The retaining ring 224 circumscribes the substrate 122 disposed within the planarizing head 204 to prevent the substrate from slipping out from under the planarizing head 204 while processing. The retaining ring 224 can be made of plastic materials such as polyphenylene sulfide (PPS), polyetheretherketone (PEEK), and the like, or conductive materials such as stainless steel, Cu, Au, Pd, and the like, or some combination thereof. It is further contemplated that a conductive retaining ring 224 may be electrically biased to control the electric field during ECMP. Conductive or biased retaining rings tend to slow the polishing rate proximate the edge of the substrate. It is contemplated that other planarizing heads may be utilized.

The first ECMP station 128 generally includes a platen assembly 230 that is rotationally disposed on the base 140. The platen assembly 230 is supported above the base 140 by a bearing 238 so that the platen assembly 230 may be rotated relative to the base 140. An area of the base 140 circumscribed by the bearing 238 is open and provides a conduit for the electrical, mechanical, pneumatic, control signals and connections communicating with the platen assembly 230.

Conventional bearings, rotary unions and slip rings, collectively referred to as rotary coupler 276, are provided such that electrical, mechanical, fluid, pneumatic, control signals and connections may be coupled between the base 140 and the rotating platen assembly 230. The platen assembly 230 is typically coupled to a motor 232 that provides the rotational motion to the platen assembly 230. The motor 232 is coupled to the controller 108 that provides a signal for controlling for the rotational speed and direction of the platen assembly 230.

A top surface 260 of the platen assembly 230 supports a processing pad assembly 222 thereon. The processing pad assembly may be retained to the platen assembly 230 by magnetic attraction, vacuum, clamps, adhesives and the like.

A plenum 206 is defined in the platen assembly 230 to facilitate uniform distribution of electrolyte to the planarizing surface 126. A plurality of passages, described in greater detail below, are formed in the platen assembly 230 to allow electrolyte, provided to the plenum 206 from an electrolyte source 248, to flow uniformly though the platen assembly 230 and into contact with the substrate 122 during processing. It is contemplated that different electrolyte compositions may be provided during different stages of processing.

The processing pad assembly 222 includes an electrode 292 and at least a planarizing portion 290. The electrode 292 is typically comprised of a conductive material, such as stainless steel, copper, aluminum, gold, silver and tungsten, among others. The electrode 292 may be solid, impermeable to electrolyte, permeable to electrolyte or perforated. At least one contact assembly 250 extends above the processing pad assembly 222 and is adapted to electrically couple the substrate being processed on the processing pad assembly 222 to the power source 242. The electrode 292 is also coupled to the power source 242 so that an electrical potential may be established between the substrate and electrode 292.

A meter (not shown) is provided to detect a metric indicative of the electrochemical process. The meter may be coupled or positioned between the power source 242 and at least one of the electrode 292 or contact assembly 250. The meter may also be integral to the power source 242. In one embodiment, the meter is configured to provide the controller 108 with a metric indicative of processing, such a charge, current and/or voltage. This metric may be utilized by the controller 108 to adjust the processing parameters in-situ or to facilitate endpoint or other process stage detection.

A window 246 is provided through the pad assembly 222 and/or platen assembly 230, and is configured to allow a sensor 254, positioned below the pad assembly 222, to sense a metric indicative of polishing performance. For example, the sensor 704 may be an eddy current sensor or an interferometer, among other sensors. The metric, provided by the sensor 254 to the controller 108, provides information that may be utilized for processing profile adjustment in-situ, endpoint detection or detection of another point in the electrochemical process. In one embodiment, the sensor 254 an interferometer capable of generating a collimated light beam, which during processing, is directed at and impinges on a side of the substrate 122 that is being polished. The interference between reflected signals is indicative of the thickness of the conductive layer of material being processed. One sensor that may be utilized to advantage is described in U.S. Pat. No. 5,893,796, issued Apr. 13, 1999, to Birang, et al., which is hereby incorporated by reference in its entirety.

Embodiments of the processing pad assembly 222 suitable for removal of conductive material from the substrate 122 may generally include a planarizing surface 126 that is substantially dielectric. Other embodiments of the processing pad assembly 222 suitable for removal of conductive material from the substrate 122 may generally include a planarizing surface 126 that is substantially conductive. At least one contact assembly 250 is provided to couple the substrate to the power source 242 so that the substrate may be biased relative to the electrode 292 during processing. Apertures 210, formed through the planarizing layer 290 and the electrode 292 and the any elements disposed below the electrode, allow the electrolyte to establish a conductive path between the substrate 112 and electrode 292.

In one embodiment, the planarizing portion 290 of the processing pad assembly 222 is a dielectric, such as polyurethane. Examples of processing pad assemblies that may be adapted to benefit from the invention are described in U.S. patent application Ser. No. 10/455,941, filed Jun. 6, 2003, entitled "Conductive Planarizing Article For Electrochemical Mechanical Planarizing", and U.S. patent application Ser. No. 10/455,895, filed Jun. 6, 2003, entitled "Conductive Planarizing Article For Electrochemical Mechanical Planarizing," both of which are hereby incorporated by reference in their entireties.

FIG. 4A is a partial sectional view of the first ECMP station 128 through two contact assemblies 250, and FIGS. 5A-C are side, exploded and sectional views of one of the contact assemblies 250 shown in FIG. 5A. The platen assembly 230 includes at least one contact assembly 250 projecting therefrom and coupled to the power source 242 that is adapted to bias a surface of the substrate 122 during processing. The contact assemblies 250 may be coupled to the platen assembly 230, part of the processing pad assembly 222, or a separate element. Although two contact assemblies 250 are shown in FIG. 3A, any number of contact assemblies may be utilized and may be distributed in any number of configurations relative to the centerline of the platen assembly 230.

The contact assemblies 250 are generally electrically coupled to the power source 242 through the platen assembly 230 and are movable to extend at least partially through respective apertures 368 formed in the processing pad assembly 222. The positions of the contact assemblies 250 may be chosen to have a predetermined configuration across the platen assembly 230. For predefined processes, individual contact assemblies 250 may be repositioned in different apertures 368, while apertures not containing contact assemblies may be plugged with a stopper 392 or filled with a nozzle 394 (as shown in FIGS. 4D-E) that allows flow of electrolyte from the plenum 206 to the substrate. One contact assembly that may be adapted to benefit from the invention is described in U.S. patent application Ser. No. 10/445,239, filed May 23, 2003, by Butterfield, et al., and is hereby incorporated by reference in its entirety.

Figure 4B:
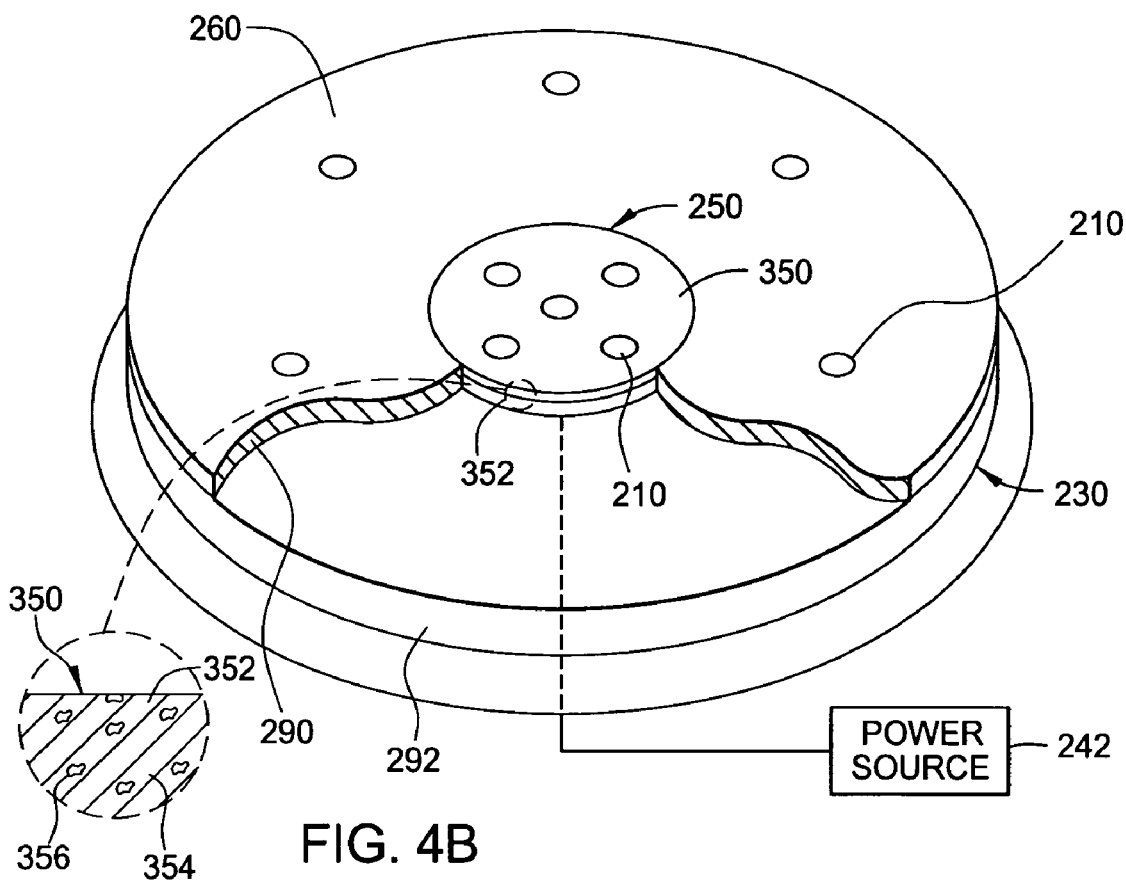
FIGS. 4B-C are sectional views of alternative embodiments of contact assemblies.

Although the embodiments of the contact assembly 250 described below with respect to FIG. 4A depicts a rolling ball contact, the contact assembly 250 may alternatively comprise a structure or assembly having a conductive upper layer or surface suitable for electrically biasing the substrate 122 during processing. For example, as depicted in FIG. 4B, the contact assembly 250 may include a pad structure 350 having an upper layer 352 made from a conductive material or a conductive composite (i.e., the conductive elements are dispersed integrally with or comprise the material comprising the upper surface), such as a polymer matrix 354 having conductive particles 356 dispersed therein or a conductive coated fabric, among others. The pad structure 350 may include one or more of the apertures 210 formed therethrough for electrolyte delivery to the upper surface of the pad assembly. Other examples of suitable contact assemblies are described in U.S. Provisional Patent Application Ser. No.

60/516,680, filed Nov. 3, 2003, by Hu, et al., which is hereby incorporated by reference in its entirety.

Figure 4C:
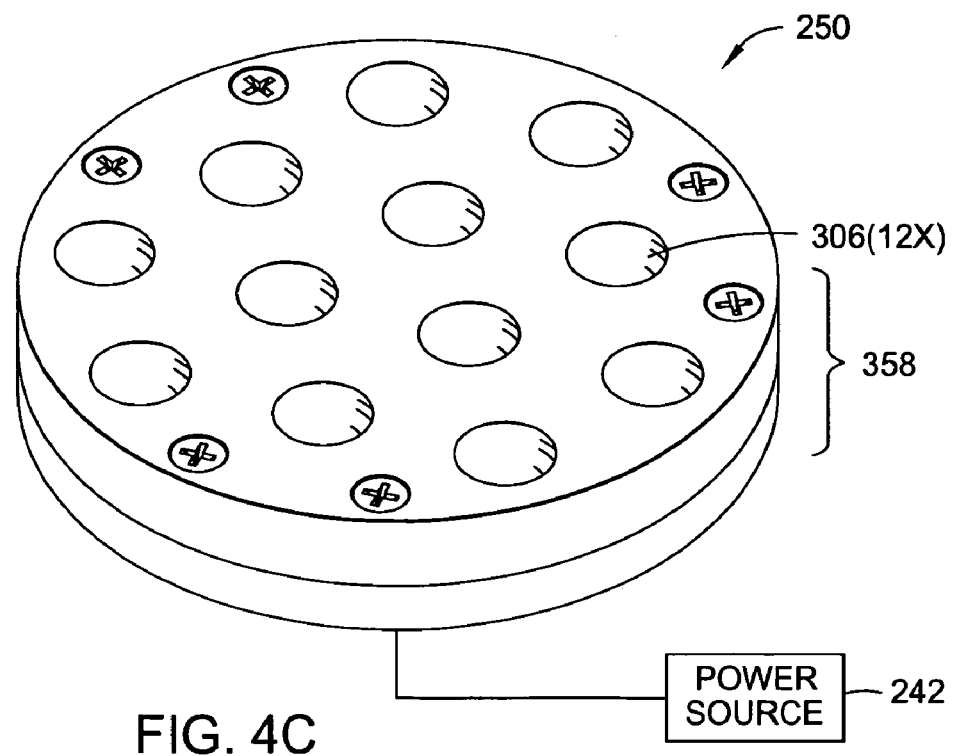

In one embodiment, each of the contact assemblies 250 includes a hollow housing 302, an adapter 304, a ball 306, a contact element 314 and a clamp bushing 316. The ball 306 has a conductive outer surface and is movably disposed in the housing 302. The ball 306 may be disposed in a first position having at least a portion of the ball 306 extending above the planarizing surface 126 and at least a second position where the ball 306 is substantially flush with the planarizing surface 126. It is also contemplated that the ball 306 may move completely below the planarizing surface 126. The ball 306 is generally suitable for electrically coupling the substrate 122 to the power source 242. It is contemplated that a plurality of balls 306 for biasing the substrate may be disposed in a single housing 358 as depicted in FIG. 4C.

The power source 242 generally provides a positive electrical bias to the ball 306 during processing. Between planarizing substrates, the power source 242 may optionally apply a negative bias to the ball 306 to minimize attack on the ball 306 by process chemistries.

The housing 302 is configured to provide a conduit for the flow of electrolyte from the source 248 to the substrate 122 during processing. The housing 302 is fabricated from a dielectric material compatible with process chemistries. A seat 326 formed in the housing 302 prevents the ball 306 from passing out of the first end 308 of the housing 302. The seat 326 optionally may include one or more grooves 348 formed therein that allow fluid flow to exit the housing 302 between the ball 306 and seat 326. Maintaining fluid flow past the ball 306 may minimize the propensity of process chemistries to attack the ball 306.

The contact element 314 is coupled between the clamp bushing 316 and the adapter 304. The contact element 314 is generally configured to electrically connect the adapter 304 and ball 306 substantially or completely through the range of ball positions within the housing 302. In one embodiment, the contact element 314 may be configured as a spring form.

In the embodiment depicted in FIGS. 4A-E and 5A-C and detailed in FIG. 6, the contact element 314 includes an annular base 342 having a plurality of flexures 344 extending therefrom in a polar array. The flexure 344 is generally fabricated from a resilient and conductive material suitable for use with process chemistries. In one embodiment, the flexure 344 is fabricated from gold plated beryllium copper.

Returning to FIGS. 4A and 5A-B, the clamp bushing 316 includes a flared head 424 having a threaded post 422 extending therefrom. The clamp bushing 316 may be fabricated from either a dielectric or conductive material, or a combination thereof, and in one embodiment, is fabricated from the same material as the housing 302. The flared head 424 maintains the flexures 344 at an acute angle relative to the centerline of the contact assembly 250 so that the flexures 344 of the contact elements 314 are positioned to spread around the surface of the ball 306 to prevent bending, binding and/or damage to the flexures 344 during assembly of the contact assembly 250 and through the range of motion of the ball 306.

The ball 306 may be solid or hollow and is typically fabricated from a conductive material. For example, the ball 306 may be fabricated from a metal, conductive polymer or a polymeric material filled with conductive material, such as metals, conductive carbon or graphite, among other conductive materials. Alternatively, the ball 306 may be formed from a solid or hollow core that is coated with a conductive material. The core may be non-conductive and at least partially coated with a conductive covering.

The ball 306 is generally actuated toward the planarizing surface 126 by at least one of spring, buoyant or flow forces. In the embodiment depicted in FIG. 5, flow through the passages formed through the adapter 304 and clamp bushing 316 and the platen assembly 230 from the electrolyte source 248 urge the ball 306 into contact with the substrate during processing.

Figure 7:
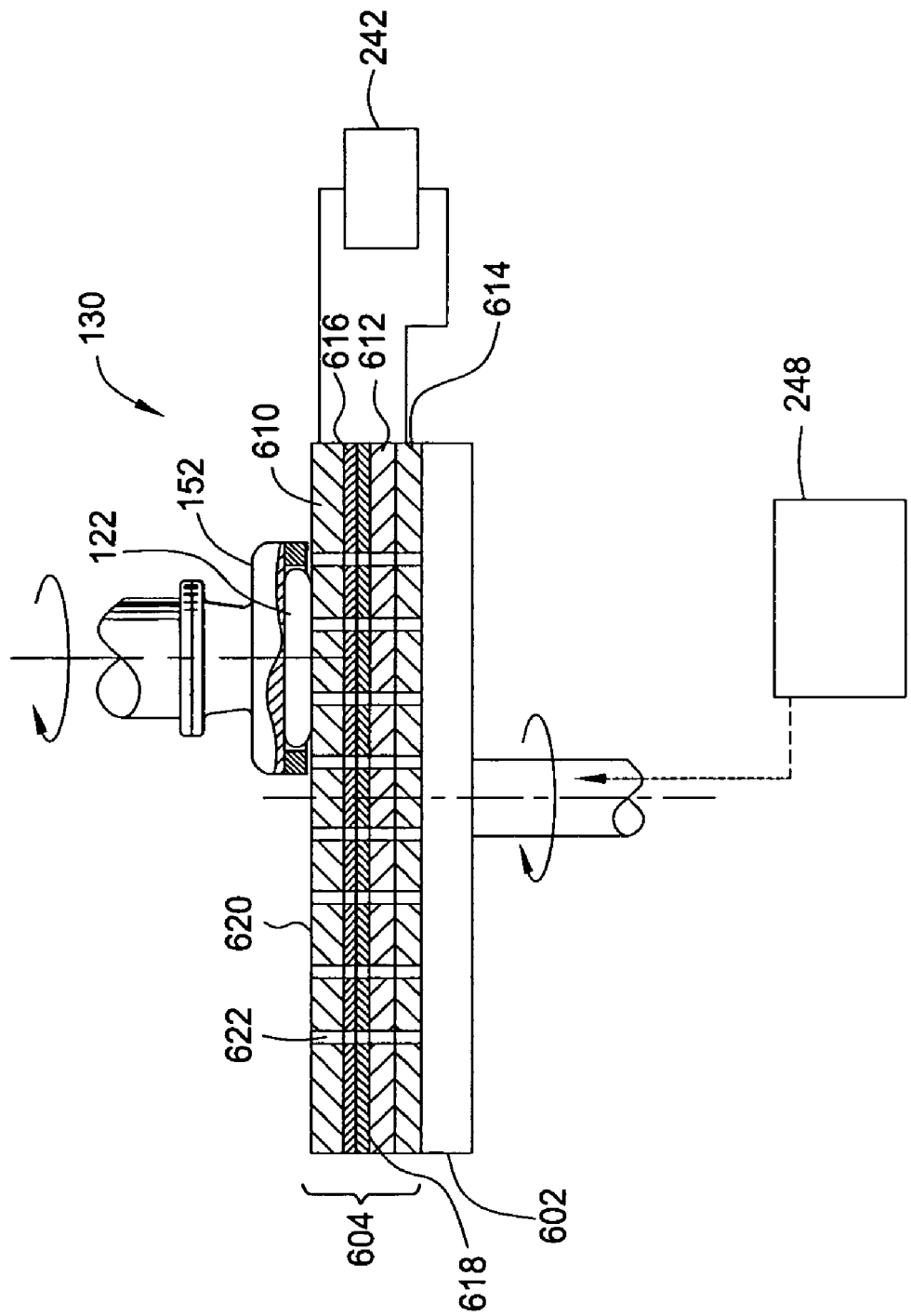
FIG. 7 is a vertical sectional view of another embodiment of an ECMP station.

FIG. 7 is a sectional view of one embodiment of the second ECMP station 130. The first and third ECMP stations 128, 132 may be configured similarly. The second ECMP station 130 generally includes a platen 602 that supports a fully conductive processing pad assembly 604. The platen 602 may be configured similar to the platen assembly 230 described above to deliver electrolyte through the processing pad assembly 604, or the platen 602 may have a fluid delivery arm (not shown) disposed adjacent thereto configured to supply electrolyte to a planarizing surface of the processing pad assembly 604. The platen assembly 602 includes at least one of a meter or sensor 254 (shown in FIG. 3) to facilitate endpoint detection.

In one embodiment, the processing pad assembly 604 includes interposed pad 612 sandwiched between a conductive pad 610 and an electrode 614. The conductive pad 610 is substantially conductive across its top processing surface and is generally made from a conductive material or a conductive composite (i.e., the conductive elements are dispersed integrally with or comprise the material comprising the planarizing surface), such as a polymer matrix having conductive particles dispersed therein or a conductive coated fabric, among others. The conductive pad 610, the interposed pad 612, and the electrode 614 may be fabricated into a single, replaceable assembly. The processing pad assembly 604 is generally permeable or perforated to allow electrolyte to pass between the electrode 614 and top surface 620 of the conductive pad 610. In the embodiment depicted in FIG. 7, the processing pad assembly 604 is perforated by apertures 622 to allow electrolyte to flow therethrough. In one embodiment, the conductive pad 610 is comprised of a conductive material disposed on a polymer matrix disposed on a conductive fiber, for example, tin particles in a polymer matrix disposed on a woven copper coated polymer. The conductive pad 610 may also be utilized for the contact assembly 250 in the embodiment of FIG. 3.

A conductive foil 616 may additionally be disposed between the conductive pad 610 and the subpad 612. The foil 616 is coupled to a power source 242 and provides uniform distribution of voltage applied by the source 242 across the conductive pad 610. In embodiments not including the conductive foil 616, the conductive pad 610 may be coupled directly, for example, via a terminal integral to the pad 610, to the power source 242. Additionally, the pad assembly 604 may include an interposed pad 618, which, along with the foil 616, provides mechanical strength to the overlying conductive pad 610. Examples of suitable pad assemblies are described in the previously incorporated U.S. patent application Ser. No. 10/455,941 and 10/455,895.

Polishing Processes

Methods are provided for polishing a substrate to remove residues and minimize dishing within features, while increasing throughput with a decrease in polishing time. The methods may be performed by an electrochemical polishing technique, which includes a combination of chemical activity, mechanical activity and electrical activity to remove conductive materials and planarize a substrate surface. The polishing compositions described herein form passivation layers on the substrate surface. The passivation layer may chemically and/or electrically insulate material disposed on a substrate surface.

In one aspect, the method may include processing a substrate having a conductive material layer disposed over features, supplying a first polishing composition, or bulk polishing composition, to the surface of the substrate, applying a first pressure between the substrate and a polishing article, providing relative motion between the substrate and the polishing article, applying a first bias between a first electrode and a second electrode in electrical contact with the substrate, removing a portion, such as at least about 50%, of the conductive material, supplying a second polishing composition, or residual polishing composition, to the surface of the substrate, applying a second pressure between the substrate and a polishing article, providing relative motion between the substrate and the polishing article, applying a second bias between a first electrode and a second electrode in electrical contact with the substrate, and removing residual conductive material from the substrate surface.

The removal of excess copper may be performed in one or more processing steps, for example, a single copper removal step or a bulk copper removal step and a residual copper removal step. Bulk material is broadly defined herein as any material deposited on the substrate in an amount more than sufficient to substantially fill features formed on the substrate surface. Residual material is broadly defined as any material remaining after one or more bulk or residual polishing process steps. Generally, in a two step process, the bulk removal during a first electrochemical mechanical polishing process removes at least about 50% of the conductive layer, preferably at least about 70%, more preferably at least about 80%, for example, at least about 90%. The residual removal during a second electrochemical mechanical polishing process removes most, if not all the remaining conductive material disposed on the barrier layer to leave behind the filled plugs.

The bulk removal electrochemical mechanical polishing process may be performed on a first polishing platen and the residual removal electrochemical mechanical polishing process on a second polishing platen of the same or different polishing apparatus as the first platen. In another embodiment of the two-step process, the residual removal electrochemical mechanical polishing process may be performed on the same platen with the bulk removal process. Any barrier material may be removed on a separate platen, such as the third platen in the apparatus described in FIG. 2. For example, the apparatus described above in accordance with the processes described herein may include three platens for removing copper material including, for example, a first platen to remove bulk material, a second platen for residual removal and a third platen for barrier removal and/or buffing the substrate surface. In such an apparatus, the bulk and the residual processes are electrochemical mechanical polishing processes and the barrier removal is a CMP process or another electrochemical mechanical polishing process. In another embodiment, three electrochemical mechanical polishing platens may be used to remove bulk material, residual removal and barrier removal.

While the following processes and compositions are described for removing copper, the invention contemplates that the compositions and processes herein also may be used for the removal of other conductive materials, such as aluminum, platinum, tungsten, titanium, titanium nitride, tantalum, tantalum nitride, cobalt, gold, silver, ruthenium and combinations thereof.

FIGS. 8A-8D are schematic cross-sectional views illustrating a polishing process performed on a substrate according to one embodiment for planarizing a substrate surface described herein. A first electrochemical mechanical polishing process may be used to remove bulk copper material from the substrate surface as shown from FIGS. 8A-8B and then a second electrochemical mechanical polishing process to remove residual copper materials as shown from FIGS. 8B-8C. Subsequent processes, such as barrier removal and buffering are used to produce the structure shown in FIG. 8D. The first electrochemical mechanical polishing process produces to a fast removal rate of the copper layer and the second electrochemical mechanical polishing process, due to the precise removal of the remaining copper material, and forms level substrate surfaces with reduced or minimal dishing and erosion of substrate features.

Figure 8A:
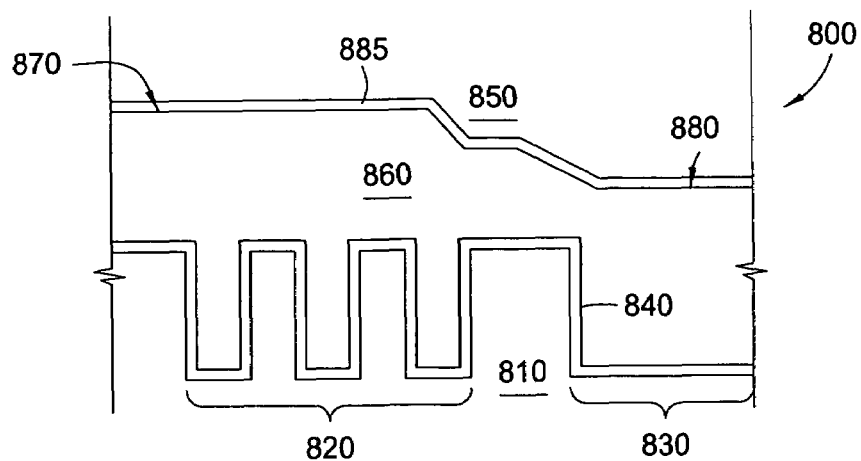
FIGS. 8A-8D are schematic cross-sectional views illustrating a polishing process performed on a substrate according to one embodiment.

FIG. 8A is a schematic cross-sectional view illustrating one embodiment of a first electrochemical mechanical polishing process for removal of bulk copper material. The substrate is disposed in an apparatus containing a first electrode. The substrate 800 has a dielectric layer 810 patterned with narrow feature definitions 820 and wide feature definitions 830. Narrow feature definitions 820 and wide feature definitions 830 have a barrier material 840, for example, titanium and/or titanium nitride, or alternatively, tantalum and/or tantalum nitride, deposited therein followed by a fill of a conductive material 860, for example, copper. The deposition profile of the excess material includes a high overburden 870, also referred to as a hill or peak, formed over narrow feature definitions 820 and a minimal overburden 880, also referred to as a valley, formed over wide feature definitions 830.

The terms narrow and wide feature definitions may vary depending on the structures formed on the substrate surface, but can generally be characterized by the respective deposition profiles of excessive material deposition (or high overburden) formed over narrow feature definitions and minimal or low material deposition (minimal or low overburden), over wide feature definitions. For example narrow feature definitions may be about 0.13 μm in size and may have a high overburden as compared to wide feature definitions that may be about 10 μm in size and that may have minimal or insufficient overburden. However, high overburdens and low overburdens do not necessarily have to form over features, but may form over areas on the substrate surface between features.

The dielectric layer 810 may comprise one or more dielectric materials conventionally employed in the manufacture of semiconductor devices. For example, dielectric materials may include materials such as silicon dioxide, phosphorus-doped silicon glass (PSG), boron-phosphorus-doped silicon glass (BPSG), and silicon dioxide derived from tetraethyl orthosilicate (TEOS) or silane by plasma enhanced chemical vapor deposition (PECVD). The dielectric layer may also comprise low dielectric constant materials, including fluorosilicon glass (FSG), polymers, such as polyamides, carbon-containing silicon oxides, such as Black Diamond™ dielectric material, silicon carbide materials, which may be doped with nitrogen and/or oxygen, including BLOK™ dielectric materials, available from Applied Materials, Inc. of Santa Clara, Calif.

A barrier layer 840 is disposed conformally in the feature definitions 820 and 830 and on the substrate 800. The barrier layer 840 may comprise metals or metal nitrides, such as tantalum, tantalum nitride, tantalum silicon nitride, titanium, titanium nitride, titanium silicon nitride, tungsten, tungsten nitride and combinations thereof, or any other material that may limit diffusion of materials between the substrate and/or dielectric materials and any subsequently deposited conductive materials.

A conductive material layer 860 is disposed on the barrier layer 840. The term "conductive material layer" as used herein is defined as any conductive material, such as copper, tungsten, aluminum, and/or their alloys used to fill a feature to form lines, contacts or vias. While not shown, a seed layer of a conductive material may be deposited on the barrier layer prior to the deposition of the conductive material layer 860 to improve interlayer adhesion and improve subsequent deposition processes. The seed layer may be of the same material as the subsequent material to be deposited.

One type of conductive material layer 860 comprises copper containing materials. Copper containing materials include copper, copper alloys (e.g., copper-based alloys containing at least about 80 weight percent copper) or doped copper. As used throughout this disclosure, the phrase "copper containing material," the word "copper," and the symbol "Cu" are intended to encompass copper, copper alloys, doped copper, and combinations thereof. Additionally, the conductive material may comprise any conductive material used in semiconductor manufacturing processing.

In the first electrochemical mechanical polishing step, a first passivation layer 885 is formed from exposure of the conductive material to the bulk polishing composition. The first passivation layer 885 forms on the exposed conductive material 860 on the substrate surface including the high overburden 870, peaks, and minimal overburden 880, valleys, formed in the deposited conductive material 860. The first passivation layer 885 chemically and/or electrically insulates the surface of the substrate from chemical and/or electrical reactions.

The process begins with a substrate being positioned in a polishing apparatus, such as the apparatus descried herein and shown in FIG. 3. A first, or bulk removal, polishing composition as described herein is provided to the substrate surface. The first polishing composition may be provided at a flow rate between about 50 and about 800 milliliters per minute, such as about 300 milliliters per minute, to the substrate surface. The conductive material exposed to a polishing composition results in the formation of the first passivation layer 885 on the conductive material layer 860.

An example of the first polishing composition for the bulk removal step includes between about 1 wt % and about 10 wt % of phosphoric acid, between about 0.1 wt % and about 6 wt % of the at least one chelating agent, between about 0.01 wt % and about 1 wt % of the corrosion inhibitor, between about 0.5 wt % and about 10 wt % of an inorganic or organic salt, between about 0.2 wt % and about 5 wt % of an oxidizer, and between about 0.05 wt % and about 1 wt % of abrasive particulates. The composition has a conductivity of between about 60 and about 64 milliSiemens/centimeter (mS/cm). Alternatively, first electrochemical mechanical polishing step may comprise the second electrochemical mechanical polishing composition as described herein. The process may also be performed with a composition temperature between about 20° C. and about 60° C.

A polishing article coupled to a polishing article assembly containing a second electrode is then physically contacted and/or electrically coupled with the substrate through a conductive polishing article. The substrate surface and polishing article are contacted at a pressure less than about 2 pounds per square inch ($lb/in^2$ or psi) (13.8 kPa). The contact pressure may include a pressure of about 1 psi (6.9 kPa) or less, for example, between about 0.01 psi (69 Pa) and about 1 psi (6.9 kPa), such as between about 0.1 (0.7 kPa) psi and about 0.8 psi (5.5 kPa) or between about 0.1 (0.7 kPa) psi and less than about 0.5 psi (3.4 kPa). In one aspect of the process, a pressure of about 0.3 psi (2.1 kPa) or less is used.

Relative motion is provided between the substrate surface and the conductive article 203 to reduce or remove the first passivation layer 885. Relative motion is provided between the substrate surface and the conductive pad assembly 222. The conductive pad assembly 222 disposed on the platen is rotated at a platen rotational rate of between about 7 rpm and about 80 rpm, for example, about 28 rpm, and the substrate disposed in a carrier head is rotated at a carrier head rotational rate between about 7 rpm and about 80 rpm, for example, about 37 rpm. The respective rotational rates of the platen and carrier head are believed to provide reduced shear forces and frictional forces when contacting the polishing article and substrate. Both the carrier head rotational speed and the platen rotational speed may be between about 7 rpm and less than 40 rpm. In one aspect of bulk polishing process, the carrier head rotational speed may be greater than a platen rotational speed by a ratio of carrier head rotational speed to platen rotational speed of greater than about 1:1, such as a ratio of carrier head rotational speed to platen rotational speed between about 1.5:1 and about 12:1, for example between about 1.5:1 and about 3:1, to remove material from the substrate surface.

A first bias from a power source 242 is applied between the two electrodes. The bias may be transferred from a conductive pad and/or electrode in the polishing article assembly 222 to the substrate 208. The bias may be applied by an electrical pulse modulation technique providing at least anodic dissolution.

The first bias is generally provided to produce anodic dissolution of the conductive material from the surface of the substrate at a current density up and about 100 $mA/cm^2$ which correlates to an applied current of about 40 amps to process substrates with a diameter up and about 300 mm. For example, a 200 mm diameter substrate may have a current density between about 0.01 $mA/cm^2$ and about 50 $mA/cm^2$, which correlates to an applied current between about 0.01 A and about 20 A. The invention also contemplates that the bias may be applied and monitored by volts, amps and watts. For example, in one embodiment, the power supply may apply a power between about 0.01 watts and 100 watts, a voltage between about 0.01 V and about 10 V, and a current between about 0.01 amps and about 10 amps. The bias between about 2.6 volts and about 3.5 volts, such as 3 volts, may be used as the applied bias in the first electrochemical processing step.

The first bias may be varied in power and application depending upon the user requirements in removing material from the substrate surface. For example, increasing power application has been observed to result in increasing anodic dissolution. The bias may also be applied by an electrical pulse modulation technique. Pulse modulation techniques may vary, but generally include a cycle of applying a constant current density or voltage for a first time period, then applying no current density or voltage or a constant reverse current density or voltage for a second time period. The process may then be repeated for one or more cycles, which may have varying power levels and durations. The power levels, the duration of power, an "on" cycle, and no power, an "off" cycle" application, and frequency of cycles, may be modified based on the removal rate, materials to be removed, and the extent of the polishing process. For example, increased power levels and increased duration of power being applied have been observed to increase anodic dissolution.

In one pulse modulation process for electrochemical mechanical polishing, the pulse modulation process comprises an on/off power technique with a period of power application, "on", followed by a period of no power application, "off". The on/off cycle may be repeated one or more times during the polishing process. The "on" periods allow for removal of exposed conductive material from the substrate surface and the "off" periods allow for polishing composition components and by-products of "on" periods, such as metal ions, to diffuse to the surface and complex with the conductive material. During a pulse modulation technique process it is believed that the metal ions migrate and interact with the corrosion inhibitors and/or chelating agents by attaching to the passivation layer in the non-mechanically disturbed areas. The process thus allows etching in the electrochemically active regions, not covered by the passivation layer, during an "on" application, and then allowing reformation of the passivation layer in some regions and removal of excess material during an "off" portion of the pulse modulation technique in other regions. Thus, control of the pulse modulation technique can control the removal rate and amount of material removed from the substrate surface.

The "on" "off" period of time may be between about 1 second and about 60 seconds each, for example, between about 2 seconds and about 25 seconds, and the invention contemplates the use of pulse techniques having "on" and "off" periods of time greater and shorter than the described time periods herein. In one example of a pulse modulation technique, power is applied between about 16% and about 66% of each cycle.

Non-limiting examples of pulse modulation technique with an on/off cycle for electrochemical mechanical polishing of materials described herein include: applying power, "on", between about 5 seconds and about 10 seconds and then not applying power, "off", between about 2 seconds and about 25 seconds; applying power for about 10 seconds and not applying power for 5 seconds, or applying power for 10 seconds and not applying power for 2 seconds, or even applying power for 5 seconds and not applying power for 25 seconds to provide the desired polishing results. The cycles may be repeated as often as desired for each selected process. One example of a pulse modulation process is described in commonly assigned U.S. Pat. No. 6,379,223, which is incorporated by reference herein to the extent not inconsistent with the claimed aspects and disclosure herein. Further examples of pulse modulation processes are described in co-pending U.S. patent application Ser. No. 10/611,805, entitled "Effective Method To Improve Surface Finish In Electrochemically Assisted Chemical Mechanical Polishing", filed on Jun. 30, 2003, which is incorporated by reference herein to the extent not inconsistent with the claimed aspects and disclosure herein.

A removal rate of conductive material of up and about 15,000 Å/min can be achieved by the processes described herein. Higher removal rates are generally desirable, but due to the goal of maximizing process uniformity and other process variables (e.g., reaction kinetics at the anode and cathode) it is common for dissolution rates to be controlled between about 100 Å/min and about 15,000 Å/min. In one embodiment of the invention where the copper material to be removed is less than 5,000 Å thick, the voltage (or current) may be applied to provide a removal rate between about 100 Å/min and about 5,000 Å/min. The substrate is typically exposed to the polishing composition and power application for a period of time sufficient to remove at least a portion or all of the desired material disposed thereon.

The first passivation layer is formed from the exposure of the substrate surface to the corrosion inhibitor and/or other materials capable of forming a passivating or insulating film, for example, chelating agents. The thickness and density of the passivation layer can dictate the extent of chemical reactions and/or amount of anodic dissolution. For example, a thicker or denser passivation layer 885 has been observed to result in less anodic dissolution compared to thinner and less dense passivation layers. Thus, control of the composition of passivating agents, corrosion inhibitors and/or chelating agents, allow control of the removal rate and amount of material removed from the substrate surface During anodic dissolution under application of the bias, the substrate surface, i.e., the conductive material layer 860 may be biased anodically above a threshold potential of the conductive material, for example, a metal material, on the substrate surface to "oxidize". When a metal material oxidizes, a metal atom gives up one or more electrons to the power source and forms metal ions or cations. The metal ions may then leave the substrate surface and dissolve into the electrolyte solution. In the case where copper is the desired material to be removed, cations can have the $Cu^{1+}$ or $Cu^{2+}$ oxidation state.

The metal ions may also contribute to the formation of the thickness and/or density of the first passivation layer 885. For example, the inhibitors and/or chelating agents found in the polishing composition may complex with the metal ions and the metal ions become incorporated into the first passivation layer 885. Thus, the presence of the inhibitors and/or chelating agents found in the polishing composition limit or reduce the electrochemical dissolution process of the metal ions into the electrolyte, and further incorporate such metal ions into the first passivation layer 885. It has been observed that the thickness and/or density of the undisturbed portion of the first passivation layer 885 may increase after periods of applied bias for anodic dissolution of conductive materials on the substrate surface. It is believed that the increase in the thickness and/or density of the undisturbed portion of the first passivation layer 885 is related to the total applied power and is a function of time and/or power levels. It has also been observed that the undisturbed portion of the passivation layer 885 incorporates metal ions and that the metal ions may contribute to the thickness and/or density of the passivation layer.

Mechanical abrasion by a conductive polishing article removes the first passivation layer 885 that insulates the conductive material chemically and/or electrically. For example, the first passivation layer suppresses the current for anodic dissolution so that areas of high overburden is preferentially removed over areas of minimal overburden as the passivation layer is retained in areas of minimal or no contact with the conductive polishing article 203. The removal rate of the conductive material 860 covered by the first passivation layer 885 is less than the removal rate of conductive material without the first passivation layer 885. As such, the excess material disposed over narrow feature definitions 820 and the substrate field 850 is removed at a higher rate than over wide feature definitions 830 still covered by the first passivation layer 885.

The polishing pressures used herein reduce or minimize damaging shear forces and frictional forces for substrates containing low k dielectric materials. Reduced or minimized forces can result in reduced or minimal deformations and defect formation of features from polishing. Further, the lower shear forces and frictional forces have been observed to reduce or minimize formation of topographical defects, such as erosion of dielectric materials and dishing of conductive materials as well as reducing delamination, during polishing. Contact between the substrate and a conductive polishing article also allows for electrical contact between the power source and the substrate by coupling the power source to the polishing article when contacting the substrate.

Figure 1B:
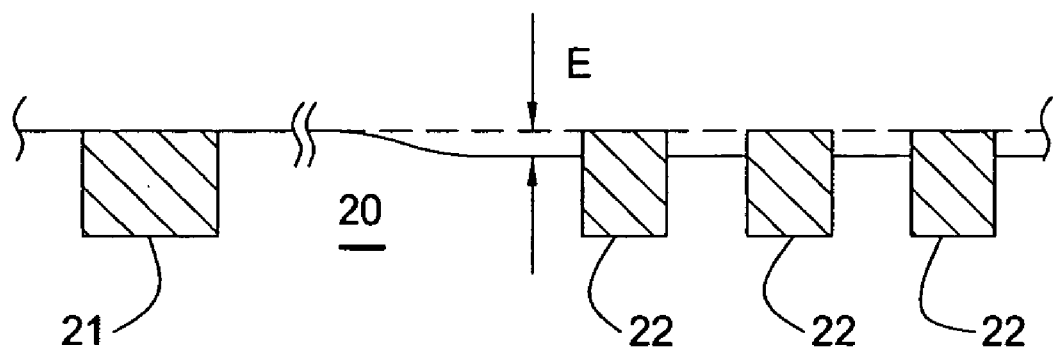

Residual material is removed with a second electrochemical mechanical polishing process. The second electrochemical mechanical polishing process provides a reduced removal rate compared to the first electrochemical mechanical polishing process step in order to prevent excess metal removal from forming topographical defects, such as concavities or depressions known as dishing D, as shown in FIG. 1A, and erosion E as shown in FIG. 1B as well as reducing delamination during polishing. Therefore, a majority of the conductive layer 860 is removed at a faster rate during the first electrochemical mechanical polishing process than the remaining or residual conductive layer 860 during the second electrochemical mechanical polishing process. The two-step electrochemical mechanical polishing process increases throughput of the total substrate processing while producing a smooth surface with little or no defects.

Figure 8B:
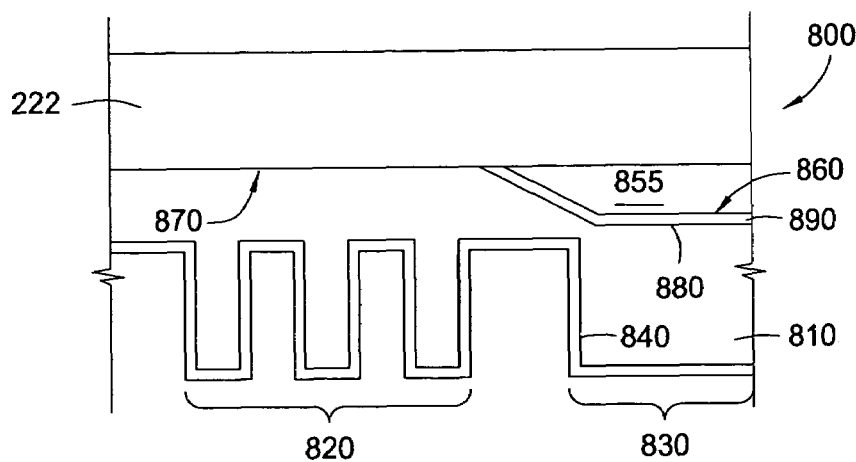

FIG. 8B illustrates the initiation of the second electrochemical mechanical polishing step after at least about 50% of the conductive material 860 was removed after the bulk removal of the first electrochemical mechanical polishing process, for example, about 90%. After the first electrochemical mechanical polishing process, conductive material 860 may still include the high overburden 870, peaks, and/or minimal overburden 880, valleys, but with a reduced proportional size. However, conductive material 860 may also be rather planar across the substrate surface (not pictured).

In the second electrochemical mechanical polishing step, a second passivation layer 890 is formed from exposure of the conductive material to the residual polishing composition. The second passivation layer 890 forms on the exposed conductive material 860 on the substrate surface. The second passivation layer 890 chemically and/or electrically insulates the surface of the substrate from chemical and/or electrical reactions.

A second, or residual removal, polishing composition as described herein for residual material removal is provided to the substrate surface. The polishing composition may be provided at a flow rate between about 50 and about 800 milliliters per minute, such as about 300 milliliters per minute, to the substrate surface.

An example of the second polishing composition for the residual removal step includes between about 1 vol % and about 10 vol % of an acid based electrolyte, between about 0.1 wt % and about 6 wt % of a chelating agent, between about 0.01 wt % and about 1 wt % of a corrosion inhibitor, between about 0.001 vol % and about 2 vol % of a passivating polymeric material, between about 1 wt. % and about 20 wt. % of a pH adjusting agent, a solvent, and a pH between about 4 and about 7. The residual composition has a conductivity of between about 20 and about 80 milliSiemens/centimeter (mS/cm), for example, between about 30 and about 60 milliSiemens/centimeter (mS/cm). A further example of a polishing composition includes about 6 vol % of phosphoric acid, about 2 wt. % of ammonium citrate, about 0.3 wt. % of benzotriazole, about 0.05 vol % of XP-1296, about 0.025 vol % of 750000 molecular weight Polyethylene imine (PEI), deionized water, and sufficient potassium hydroxide to provide a pH of about 5.75, and a conductivity of about 54 mS/cm.

The mechanical abrasion in the above residual removal process is performed at the first electrochemical mechanical polishing process step contact pressure of less than about 2 pounds per square inch (lb/in² or psi) (13.8 kPa) between the polishing pad and the substrate. Removal of the conductive material 860 may be performed with a process having a pressure of about 1 psi (6.9 kPa) or less, for example, between about 0.01 psi (69 Pa) and about 1 psi (6.9 kPa), such as between about 0.1 (0.7 kPa) psi and about 0.8 psi (5.5 kPa). In one aspect of the process, a pressure of about 0.3 psi (2.1 kPa) or less is used. Alternatively, the pressure of the second electrochemical mechanical polishing step may be reduced compared to the first electrochemical mechanical polishing step to further reduce the removal rate of the copper material. Contact between the substrate and a conductive polishing article also allows for electrical contact between the power source and the substrate by coupling the power source to the polishing article when contacting the substrate.

Relative motion is provided between the substrate surface and the conductive pad assembly 222, preferably a fully conductive pad assembly should be assembly 620 as shown in FIG. 7. A fully conductive polishing pad assembly may be used to improve the residual removal efficiency of the copper material. The conductive pad assembly disposed on the platen is rotated at a rotational rate of between about 7 rpm and about 80 rpm, such as between about 7 rpm and about 50 rpm, for example, about 20 rpm, and the substrate disposed in a carrier head is rotated at a rotational rate between about 7 rpm and about 80 rpm, such as between about 7 rpm and about 70 rpm, for example, about 21 rpm. In one aspect of the second processes step the carrier head rotational speed greater than a platen rotational speed by a ratio of carrier head rotational speed to platen rotational speed of greater than about 1:1, such as a ratio of carrier head rotational speed to platen rotational speed between about 1.5:1 and about 12:1, for example between about 1.5:1 and about 3:1, to remove material from the substrate surface. The respective rotational rates of the platen and carrier head are believed to provide reduce shear forces and frictional forces when contacting the polishing article and substrate.

The bias applied for the second electrochemical mechanical polishing step, or residual polishing step, includes a power application is a current density of between about 3 W/cm² and about 20 W/cm². A voltage of between about 1.5 volts and about 3 volts, such as 2 volts, may be used as the applied bias in the second electrochemical processing step. The second bias may be less than the bias of the first electrochemical polishing step, the bulk polishing step. The substrate is typically exposed to the polishing composition and power application for a period of time sufficient to remove at least a portion or all of the desired material disposed thereon. The process may also be performed at a temperature between about 20° C. and about 60° C.

The polymeric inhibitor of the second polishing composition is believed to form a second passivation layer 890 on the surface of the exposed copper material as shown in FIG. 8B. The second passivation layer 890 is believed to chemically and/or electrically insulate material disposed on a substrate surface. The second passivation layer 890 is formed by a physical and chemical interaction between the second polishing composition having the polymeric material and the exposed copper material. The second passivation layer 890 may mechanically interact with the exposed conductive material by forming a viscous layer that inhibits fluid flow, or mass transportation, of polishing composition to and from the exposed conductive material. This inhibiting flow can be effective in reducing removal of copper material in recessed areas. The second passivation layer 890 provides a reduce removal rate when formed over portions of the copper material, and allows a higher removal rate at areas of the substrate surface where the second passivation layer 890 is not formed, such as when removed by physical contact with the polishing pad 620 (or 222).

Mechanical abrasion by a conductive polishing article removes or disturbs the second passivation layer 890 that insulates or suppresses the current for anodic dissolution, such that areas of high overburden are preferentially removed over areas of minimal overburden as the second passivation layer 890 is retained in areas of minimal or no contact with the conductive pad assembly 222. The removal rate of the conductive material 860 covered by the second passivation layer 890 is less than the removal rate of conductive material without the second passivation layer 890. As such, the excess material disposed over narrow feature definitions 820 and the substrate field 850 is removed at a higher rate than over wide feature definitions 830 still covered by the second passivation layer 890.

The thickness and density of the second passivation layer 890 can dictate the extent of chemical reactions and/or amount of anodic dissolution. For example, a thicker or denser second passivation layer 890 has been observed to result in less anodic dissolution compared to thinner and less dense passivation layers. Thus, control of the composition of pH of the composition, i.e., polymeric inhibitors and additional compounds, allow control of the removal rate and amount of material removed from the substrate surface.

Figure 8C:
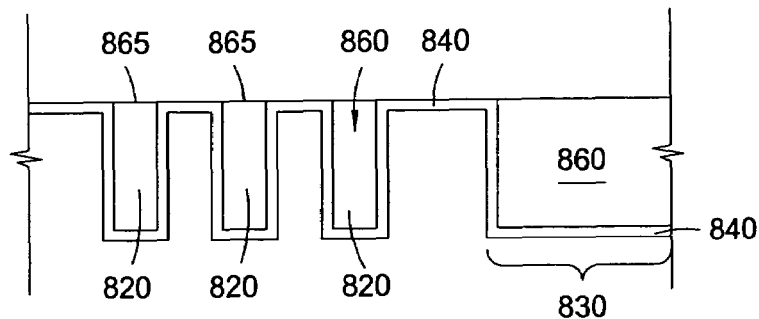
Figure 8D:
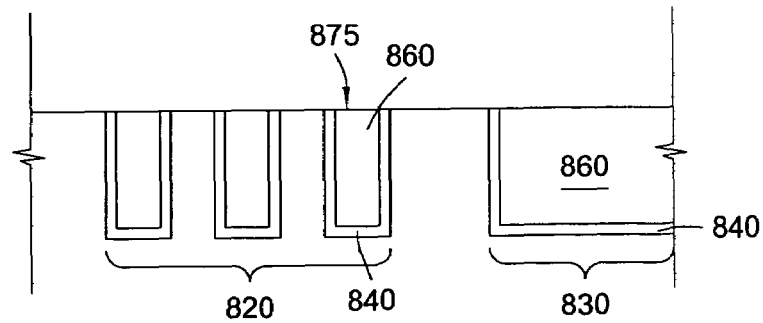

Referring to FIG. 8C, most, if not all of the conductive layer 860 is removed to expose barrier layer 840 and conductive trenches 865 by polishing the substrate with a second, residual, electrochemical mechanical polishing process including the second electrochemical mechanical polishing composition described herein. The conductive trenches 865 are formed by the remaining conductive material 860. The barrier material may then be polished by a third polishing step to provide a planarized substrate surface containing conductive trenches 875, as depicted in FIG. 8D. The third polishing process may be a third electrochemical mechanical polishing process or a CMP process. An example of a barrier polishing process is disclosed in U.S. patent Ser. No. 10/193,810, entitled, "Dual Reduced Agents for Barrier Removal in Chemical Mechanical Polishing," filed Jul. 11, 2002, published as U.S. patent Publication Number 20030013306, which is incorporated herein to the extent not inconsistent with the claims aspects and disclosure herein. A further example of a barrier polishing process is disclosed in U.S. patent application Ser. No. 60/572,183 filed on May 17, 2004, which is incorporated herein to the extent not inconsistent with the claims aspects and disclosure herein.

After conductive material and barrier material removal processing steps, the substrate may then be buffed to minimize surface defects. Buffing may be performed with a soft polishing article, i.e., a hardness of about 40 or less on the Shore D hardness scale as described and measured by the American Society for Testing and Materials (ASTM), headquartered in Philadelphia, Pa., at reduced polishing pressures, such as about 2 psi or less.

Optionally, a cleaning solution may be applied to the substrate after each of the polishing processes to remove particulate matter and spent reagents from the polishing process as well as help minimize metal residue deposition on the polishing articles and defects formed on a substrate surface. An example of a suitable cleaning solution is Electra Clean™, commercially available from Applied Materials, Inc., of Santa Clara, Calif.

Finally, the substrate may be exposed to a post polishing cleaning process to reduce defects formed during polishing or substrate handling. Such processes can minimize undesired oxidation or other defects in copper features formed on a substrate surface. An example of such a post polishing cleaning is the application of Electra Clean™, commercially available from Applied Materials, Inc., of Santa Clara, Calif.

It has been observed that substrate planarized by the processes described herein have exhibited reduced topographical defects, such as dishing and erosion, reduced residues, improved planarity, and improved substrate finish.

Polishing Compositions

Suitable polishing compositions that may be used with the processes described herein are as follows. A bulk polishing composition may include an acid based electrolyte, a chelating agent, an oxidizer, a corrosion inhibitor, an inorganic or organic acid salt, abrasive particles, a pH adjusting agent, a pH between about 3 and about 10, and a solvent. A residual polishing composition may include an acid based electrolyte, a chelating agent, a corrosion inhibitor, a passivating polymeric material, a pH adjusting agent, a pH between about 3 and about 10, and a solvent. The residual polishing composition may also include an oxidizer and/or abrasive particulates.

Although the polishing compositions are particularly useful for removing copper, it is believed that the polishing compositions also may be used for the removal of other conductive materials, such as aluminum, platinum, tungsten, titanium, titanium nitride, tantalum, tantalum nitride, cobalt, gold, silver, ruthenium and combinations thereof.

A bulk polishing composition, a first electrochemical mechanical polishing step composition, may include an acid based electrolyte, a chelating agent, an oxidizer, a corrosion inhibitor, an inorganic or organic acid salt, abrasive particles, a pH adjusting agent, a pH between about 3 and about 10, and a solvent.

The bulk polishing composition includes an acid based electrolyte system for providing electrical conductivity. Suitable acid based electrolyte systems include, for example, phosphoric acid based electrolytes, sulfuric acid, nitric acid, perchloric acid, acetic acid, citric acid, salts thereof and combinations thereof. Suitable acid based electrolyte systems include an acid electrolyte, such as phosphoric acid, boric acid and/or citric acid, as well as acid electrolyte derivatives, including ammonium, potassium, sodium, calcium and copper salts thereof. The acid based electrolyte system may also buffer the composition to maintain a desired pH level for processing a substrate.

Examples of suitable acid based electrolytes include compounds having a phosphate group ($Po_{43}^{-1}$), such as, phosphoric acid, copper phosphate, potassium phosphates ($KXH(3-X)PO4$) (x=1, 2 or 3), such as potassium dihydrogen phosphate (KH2PO4), dipotassium hydrogen phosphate (K2HPO4), ammonium phosphates (($NH4)XH(3-X)PO4$) (x=1, 2 or 3), such as ammonium dihydrogen phosphate ((NH4)H2PO4), diammonium hydrogen phosphate ((NH4)2HPO4), compounds having a nitrite group (NO31-), such as, nitric acid or copper nitrate, compounds having a boric group (BO33-), such as, orthoboric acid (H3BO3) and compounds having a sulfate group (SO42-), such as sulfuric acid (H2SO4), ammonium hydrogen sulfate ((NH4)HSO4), ammonium sulfate, potassium sulfate, copper sulfate, derivatives thereof and combinations thereof. The invention also contemplates that conventional electrolytes known and unknown may also be used in forming the composition described herein using the processes described herein.

The acid based electrolyte system may contains an acidic component that can take up about 1 and about 30 percent by weight (wt %) or volume (vol %) of the total composition of solution to provide sufficient conductivity as described herein for practicing the processes described herein. Examples of acidic components include dihydrogen phosphate and/or diammonium hydrogen phosphate and may be present in the bulk polishing composition in amounts between about 15 wt % and about 25 wt %. Alternately, phosphoric acid may be present in concentrations up to 30 wt %, for example, between about 2 wt % and about 6 wt %. The acid based electrolyte may also be added in solution, for example, the 6 wt. % of phosphoric acid may be from 85% aqueous phosphoric acid solution for an actual phosphoric acid composition of about 5.1 wt. %.

One aspect or component of the present invention is the use of one or more chelating agents to complex with the surface of the substrate to enhance the electrochemical dissolution process. In any of the embodiments described herein, the chelating agents can bind to a conductive material, such as copper ions, increase the removal rate of metal materials and/or improve dissolution uniformity across the substrate surface. The metal materials for removal, such as copper, may be in any oxidation state, such as 0, 1, or 2, before, during or after ligating with a functional group. The functional groups can bind the metal materials created on the substrate surface during processing and remove the metal materials from the substrate surface. The chelating agents may also be used to buffer the bulk polishing composition to maintain a desired pH level for processing a substrate. The chelating agents may also form or enhance the formation of the second passivation layer on the substrate surface.

The one or more chelating agents can include compounds having one or more functional groups selected from the group of amine groups, amide groups, carboxylate groups, dicarboxylate groups, tricarboxylate groups, hydroxyl groups, a mixture of hydroxyl and carboxylate groups, and combinations thereof. The one or more chelating agents may also include salts of the chelating agents described herein. The bulk polishing composition may include one or more chelating agents at a concentration between about 0.1% and about 15% by volume or weight, but preferably utilized between about 0.1% and about 4% by volume or weight. For example, about 2% by volume of ethylenediamine may be used as a chelating agent.

Examples of suitable chelating agents having one or more carboxylate groups include citric acid, tartaric acid, succinic acid, oxalic acid, amino acids, salts thereof, and combinations thereof. For example, chelating agents may include ammonium citrate, potassium citrate, ammonium succinate, potassium succinate, ammonium oxalate, potassium oxalate, potassium tartarate, and combinations thereof. The salts may have multi-basic states, for example, citrates have mono-, di- and tri-basic states. Other suitable acids having one or more carboxylate groups include acetic acid, adipic acid, butyric acid, capric acid, caproic acid, caprylic acid, glutaric acid, glycolic acid, formaic acid, fumaric acid, lactic acid, lauric acid, malic acid, maleic acid, malonic acid, myristic acid, plamitic acid, phthalic acid, propionic acid, pyruvic acid, stearic acid, valeric acid, derivatives thereof, salts thereof and combinations thereof. Further examples of suitable chelating agents include compounds having one or more amine and amide functional groups, such as ethylenediamine (EDA), diethylenetriamine, diethylenetriamine derivatives, hexadiamine, amino acids, glycine, ethylenediaminetetraacetic acid (EDTA), methylformamide, derivatives thereof, salts thereof and combinations thereof. For example, EDTA includes the acid as well as a variety of salts, such as sodium, potassium and calcium (e.g., $Na_2EDTA$, $Na_4EDTA$, $K_4EDTA$ or $Ca_2EDTA$).

In any of the embodiments described herein, the inorganic or organic acid salts may be used to perform as a chelating agent. The bulk polishing composition may include one or more inorganic or organic salts at a concentration between about 0.1% and about 15% by volume or weight of the composition, for example, between about 0.1% and about 8% by volume or weight. For example, about 2% by weight of ammonium citrate may be used in the bulk polishing composition. The chelating agent may also be added in solution or in a substantially pure form, for example, ammonium citrate may be added in a 98% pure form.

Examples of suitable inorganic or organic acid salts include ammonium and potassium salts or organic acids, such as ammonium oxalate, ammonium citrate, ammonium succinate, monobasic potassium citrate, dibasic potassium citrate, tribasic potassium citrate, potassium tartarate, ammonium tartarate, potassium succinate, potassium oxalate, and combinations thereof. Additionally, ammonium and potassium salts of the carboxylate acids may also be used.

In any of the embodiments described herein, the corrosion inhibitors can be added to reduce the oxidation or corrosion of metal surfaces by enhancing the formation of the second passivation layer 890 that minimizes the chemical interaction between the substrate surface and the surrounding electrolyte. The layer of material formed by the corrosion inhibitors thus tends to suppress or minimize the electrochemical current from the substrate surface to limit electrochemical deposition and/or dissolution. The bulk polishing composition may include between about 0.001% and about 5.0% by weight of the organic compound from one or more azole groups. The commonly preferred range being between about 0.2% and about 0.4% by weight. The corrosion inhibitor may also be added in solution or in a substantially pure form, for example, benzotriazole may be added in a 99% pure form.

Suitable corrosion inhibitors include compounds having a nitrogen atom (N), such as organic compounds having azole groups. Examples of suitable compounds include benzotriazole (BTA), mercaptobenzotriazole, 5-methyl-1-benzotriazole (TTA), and combinations thereof. Other suitable corrosion inhibitors include film forming agents that are cyclic compounds, for example, imidazole, benzimidazole, triazole, and combinations thereof. Derivatives of benzotriazole, imidazole, benzimidazole, triazole, with hydroxy, amino, imino, carboxy, mercapto, nitro and alkyl substituted groups may also be used as corrosion inhibitors. Other corrosion inhibitor includes urea and thiourea among others.

Alternatively, polymeric inhibitors, for non-limiting examples, polyalkylaryl ether phosphate or ammonium nonylphenol ethoxylate sulfate, may be used in replacement or conjunction with azole containing corrosion inhibitors in an amount between about 0.002% and about 1.0% by volume or weight of the composition.

One or more pH adjusting agents is preferably added to the bulk polishing composition to achieve a pH between about 2 and about 10, and preferably between a pH of about 3 and about 7. The amount of pH adjusting agent can vary as the concentration of the other components is varied in different formulations, but in general the total solution may include up and about 70 wt % of the one or more pH adjusting agents, but preferably between about 0.2% and about 25% by volume. Different compounds may provide different pH levels for a given concentration, for example, the composition may include between about 0.1% and about 10% by volume of a base, such as potassium hydroxide, ammonium hydroxide, sodium hydroxide or combinations thereof, providing the desired pH level. The pH adjusting eagent may also be added in solution or in a substantially pure form, for example, potassium hydroxide may be added in a 45% aqueous potassium hydroxide solution.

The one or more pH adjusting agents can be chosen from a class of organic acids, for example, carboxylic acids, such as acetic acid, citric acid, oxalic acid, phosphate-containing components including phosphoric acid, ammonium phosphates, potassium phosphates, and combinations thereof, or a combination thereof. Inorganic acids including phosphoric acid, sulfuric acid, hydrochloric, nitric acid, derivatives thereof and combinations thereof, may also be used as a pH adjusting agent in the bulk polishing composition.

The balance or remainder of the bulk polishing compositions described herein is a solvent, such as a polar solvent, including water, preferably deionized water. Other solvents may be used solely or in combination with water, such as organic solvents. Organic solvents include alcohols, such as isopropyl alcohol or glycols, ethers, such as diethyl ether, furans, such as tetrahydrofuran, hydrocarbons, such as pentane or heptane, aromatic hydrocarbons, such as benzene or toluene, halogenated solvents, such as methylene chloride or carbon tetrachloride, derivatives, thereof and combinations thereof.

The bulk polishing composition may further include one or more surface finish enhancing and/or removal rate enhancing materials including abrasive particles, one or more oxidizers, and combinations thereof.

Abrasive particles may be used to improve the surface finish and removal rate of conductive materials from the substrate surface during polishing. The addition of abrasive particles to the bulk polishing composition can allow the final polished surface to achieve a surface roughness of that comparable with a conventional CMP process even at low pad pressures. Surface finish, or surface roughness, has been shown to have an effect on device yield and post polishing surface defects. Abrasive particles may comprise up and about 30 wt % of the bulk polishing composition during processing. A concentration between about 0.001 wt % and about 5 wt % of abrasive particles may be used in the bulk polishing composition.

Suitable abrasives particles include inorganic abrasives, polymeric abrasives, and combinations thereof. Inorganic abrasive particles that may be used in the electrolyte include, but are not limited to, silica, alumina, zirconium oxide, titanium oxide, cerium oxide, germania, or any other abrasives of metal oxides, known or unknown. For example, colloidal silica may be positively activated, such as with an alumina modification or a silica/alumina composite. The typical abrasive particle size used in one embodiment of the current invention is generally between about 1 nm and about 1,000 nm, preferably between about 10 nm and about 100 nm. Generally, suitable inorganic abrasives have a Mohs hardness of greater than 6, although the invention contemplates the use of abrasives having a lower Mohs hardness value.

The polymer abrasives described herein may also be referred to as "organic polymer particle abrasives", "organic abrasives" or "organic particles." The polymeric abrasives may comprise abrasive polymeric materials. Examples of polymeric abrasives materials include polymethylmethacrylate, polymethyl acrylate, polystyrene, polymethacrylonitrile, and combinations thereof.

The polymeric abrasives may have a Hardness Shore D of between about 60 and about 80, but can be modified to have greater or lesser hardness value. The softer polymeric abrasive particles can help reduce friction between a polishing article and substrate and may result in a reduction in the number and the severity of scratches and other surface defects as compared to inorganic particles. A harder polymeric abrasive particle may provide improved polishing performance, removal rate and surface finish as compared to softer materials.

The hardness of the polymer abrasives can be varied by controlling the extent of polymeric cross-linking in the abrasives, for example, a higher degree of cross-linking produces a greater hardness of polymer and, thus, abrasive. The polymeric abrasives are typically formed as spherical shaped beads having an average diameter between about 0.1 micron and about 20 microns or less.

The polymeric abrasives may be modified to have one ore more functional groups that can bind to the conductive material or conductive material ions, thereby facilitating the electrochemical mechanical polishing removal of material from the surface of a substrate. For example, if copper is to be removed in the polishing process, the organic polymer particles can be modified to have an amine group, a carboxylate group, a pyridine group, a hydroxide group, ligands with a high affinity for copper, or combinations thereof, to bind the removed copper as substitutes for or in addition to the chemically active agents in the bulk polishing composition, such as the chelating agents or corrosion inhibitors. The substrate surface material, such as copper, may be in any oxidation state, such as 0, 1+, or 2+, before, during or after ligating with a functional group. The functional groups can bind to the metal material(s) on the substrate surface to help improve the uniformity and surface finish of the substrate surface.

Additionally, the polymeric abrasives have desirable chemical properties, for example, the polymer abrasives are stable over a broad pH range and are not prone to aggregating to each other, which allow the polymeric abrasives to be used with reduced or no surfactant or no dispersing agent in the composition.

Alternatively, inorganic particles coated with the polymeric materials described herein may also be used with the bulk polishing composition. It is within the scope of the current invention for the bulk polishing composition to contain polymeric abrasives, inorganic abrasives, the polymeric coated inorganic abrasives, and any combination thereof depending on the desired polishing performance and results.

The optional oxidizer can be present in the bulk polishing composition in an amount ranging between about 0.01% and about 100% by volume or weight, for example, between about 0.1% and about 20% by volume or weight. In an embodiment of the bulk polishing composition, between about 0.1% and about 15% by volume or weight of hydrogen peroxide is present in the bulk polishing composition. In one embodiment, the oxidizer is added to the rest of the bulk polishing composition just prior to beginning the electrochemical mechanical polishing process. The oxidizer may be added to the composition in a solution, such as a 30% aqueous hydrogen peroxide solution or a 40% aqueous hydrogen peroxide solution.

Examples of suitable oxidizers include peroxy compounds, e.g., compounds that may disassociate through hydroxy radicals, such as hydrogen peroxide and its adducts including urea hydrogen peroxide, percarbonates, and organic peroxides including, for example, alkyl peroxides, cyclical or aryl peroxides, benzoyl peroxide, peracetic acid, and ditertbutyl peroxide. Sulfates and sulfate derivatives, such as monopersulfates and dipersulfates may also be used including for example, ammonium peroxydisulfate, potassium peroxydisulfate, ammonium persulfate, and potassium persulfate. Salts of peroxy compounds, such as sodium percarbonate and sodium peroxide may also be used.

The oxidizer can also be an inorganic compound or a compound containing an element in its highest oxidation state. Examples of inorganic compounds and compounds containing an element in its highest oxidation state include but are not limited to periodic acid, periodate salts, perbromic acid, perbromate salts, perchloric acid, perchloric salts, perbonic acid, nitrate salts (such as cerium nitrate, iron nitrate, ammonium nitrate), ferrates, perborate salts and permanganates. Other oxidizers include bromates, chlorates, chromates, iodates, iodic acid, and cerium (IV) compounds such as ammonium cerium nitrate.

One or more oxidizers may be used herein to enhance the removal or removal rate of the conductive material from the substrate surface. An oxidizer is generally an agent that reacts with a material by accepting an electron(s). In the current embodiment the oxidizer is used to react with the surface of the substrate that is to be polished, which then aids in the removal of the desired material. For example, an oxidizer may be used to oxidize a metal layer to a corresponding oxide or hydroxide, for example, copper to copper oxide. Existing copper that has been oxidized, including $Cu^{1+}$ ions, may further be oxidized to a higher oxidation state, such as $Cu^{2+}$ ions, which may then promote the reaction with one or more of the chelating agents. Also, in some instances the oxidizer can be used in some chemistries (e.g., low pH) that can enhance the chemical etching of the surface of the substrate to further increase the removal rate from the anode surface. In cases where no bias is applied to the surface of the substrate the inhibitors and chelating agents will complex with the metal ions on the surface that become dislodged from the surface due to the relative motion and pressure applied by the conductive article 203. The addition of abrasives can further improve the removal rate of the complexed metal ions due to the abrasive particles ability to increase that contact area between the conductive article 203 and the substrate surface.

In the case of electrochemical mechanical polishing, the conductive layer on the substrate surface is biased anodically above a threshold potential, by use of the power source 242 and the electrode 209, thus causing the metal on the substrate surface to "oxidize" (i.e., a metal atom gives up one or more electrons to the power source 242). The ionized or "oxidized" metal atoms thus dissolve into the electrolyte solution with the help of components in the electrolyte. In the case where copper is the desired material to be removed, it can be oxidized to a $Cu^{1+}$ or a $Cu^{2+}$ oxidation state. Due to the presence of the inhibitors and/or chelating agents found in the bulk polishing composition, the electrochemical dissolution process of the metal ions into the electrolyte is more limited than a polishing composition which does not contain these components. The presence of the inhibitors and/or chelating agents also appears to have an effect on the attachment strength of the metal ion(s) and inhibitor and/or chelating agent complex to the surface of the substrate. It has been found that in one embodiment that the removal rate in an electrochemical mechanical polishing process can be increased by the addition of an oxidizer. It is thought that the oxidizer tends to further oxidize the metal ions formed due to the anodic bias, which in the case of copper brings it to the more stable $Cu^{2+}$ oxidation state. The inhibitors and/or chelating agents found in the bulk polishing composition complex with the oxidized metal ions which tend to have a lower attachment, or bond, strength due to the way the inhibitor bonds to the oxidized metal ion and metal surface. The lower attachment strength allows the complexed metal ion to be more easily and efficiently removed due to the interaction of the substrate surface and the conductive article 203. The addition of abrasives to the electrochemical mechanical polishing bulk polishing composition can further improve the removal rate of the complexed metal ions due to the abrasive particles ability to increase contact area between the conductive article 203 and the substrate surface.

Further, controlling the amounts and types of constituents of the bulk polishing composition, such as corrosion inhibitors and oxidizers, can result in tuning the desired removal rate of the process. For example reduced amounts of corrosion inhibitor will result in an increase in the material removal rate as compared to compositions having higher corrosion inhibitor concentrations. In cases where the bulk polishing composition does not contain corrosion inhibitors the electrochemical mechanical polishing material removal rate is greatly increased over a polishing composition which contains a corrosion inhibitor due to the formation of the metal ions and inhibitor complex which tends to shield the surface of the substrate to the electrolyte. Likewise reduced amounts of oxidizers will generally result in lower removal rates compared to compositions having higher oxidizer compositions. It has been suggested that at low concentrations of the oxidizer, the corrosion inhibitor and/or chelating agent can complex with a metal ion before it becomes oxidized further by the oxidizer due to kinetic effects limiting the supply of the oxidizer to the surface of the substrate. The corrosion inhibitor and metal ion complex can thus affect the removal efficiency due to the formation of the stronger attachment strength complexed metal ions.

An example of a bulk polishing composition described herein includes about 2% by volume ethylenediamine, about 2% by weight ammonium citrate, about 0.3% by weight benzotriazole, between about 0.1% and about 3% by volume or weight, for example, about 0.45% hydrogen peroxide, and/or about between about 0.01% and 1% by weight, for example 0.15% by weight, of abrasive particles, and about 6% by volume phosphoric acid. The pH of the composition is about 5, which may be achieved by, for example, the composition further including potassium hydroxide to adjust the pH to the preferred range. The remainder of the bulk polishing composition is deionized water.

The bulk polishing composition may include one or more additive compounds. Additive compounds include electrolyte additives including, but not limited to, suppressors, enhancers, levelers, brighteners, stabilizers, and stripping agents to improve the effectiveness of the bulk polishing composition in polishing of the substrate surface. For example, certain additives may decrease the ionization rate of the metal atoms, thereby inhibiting the dissolution process, whereas other additives may provide a finished, shiny substrate surface. The additives may be present in the bulk polishing composition in concentrations up and about 15% by weight or volume, and may vary based upon the desired result after polishing.

Further examples of additives to the bulk polishing composition are more fully described in U.S. patent application Ser. No. 10/141,450, filed on May 7, 2002, which is incorporated by reference herein to the extent not inconsistent with the claimed aspects and disclosure herein.

A residual polishing composition may include an acid based electrolyte, a chelating agent, a corrosion inhibitor, a passivating polymeric material, a pH adjusting agent, a pH between about 3 and about 10, and a solvent. The residual polishing composition may be an abrasive free polishing composition and optionally, may further include an oxidizer, abrasive particles, or a combination of the two.

The residual polishing composition includes an acid based electrolyte system for providing electrical conductivity. Suitable acid based electrolyte systems include, for example, phosphoric acid based electrolytes, sulfuric acid, nitric acid, perchloric acid, acetic acid, citric acid, salts thereof and combinations thereof. Suitable acid based electrolyte systems include an acid electrolyte, such as phosphoric acid, boric acid and/or citric acid, as well as acid electrolyte derivatives, including ammonium, potassium, sodium, calcium and copper salts thereof. The acid based electrolyte system may also buffer the composition to maintain a desired pH level for processing a substrate.

Examples of suitable acid based electrolytes include compounds having a phosphate group ($PO_4^{3-}$), such as, phosphoric acid, copper phosphate, potassium phosphates ($K_xH_{(3-x)}PO_4$) (x=1, 2 or 3), such as potassium dihydrogen phosphate ($KH_2PO_4$), dipotassium hydrogen phosphate ($K2HPO4$), ammonium phosphates (($NH_4$)XH(3−X)$PO_4$) (x=1, 2 or 3), such as ammonium dihydrogen phosphate (($NH_4$)$H_2PO_4$), diammonium hydrogen phosphate (($NH_4$)$_2HPO_4$), compounds having a nitrite group ($NO_3^{1-}$), such as, nitric acid or copper nitrate, compounds having a boric group ($BO_3^{3-}$), such as, orthoboric acid ($H_3BO_3$) and compounds having a sulfate group ($SO_4^{2-}$), such as sulfuric acid ($H_2SO_4$), ammonium hydrogen sulfate (($NH_4$)$HSO_4$), ammonium sulfate, potassium sulfate, copper sulfate, derivatives thereof and combinations thereof. The invention also contemplates that conventional electrolytes known and unknown may also be used in forming the composition described herein using the processes described herein.

The acid based electrolyte system may contains an acidic component that can take up about 1 and about 30 percent by weight (wt %) or volume (vol %) of the total composition of solution to provide suitable conductivity for practicing the processes described herein. Examples of acidic components include dihydrogen phosphate and/or diammonium hydrogen phosphate and may be present in the polishing composition in amounts between about 15 wt % and about 25 wt %. Alternately, phosphoric acid may be present in concentrations up to 30 wt %, for example, between about 2 wt % and about 6 wt %. The acid based electrolyte may also be added in solution, for example, the 6 wt. % of phosphoric acid may be from 85% aqueous phosphoric acid solution for an actual phosphoric acid composition of about 5.1 wt. %.

One aspect or component of the present invention is the use of one or more chelating agents to complex with metal ions and/or the surface of the substrate to enhance the electrochemical dissolution process. The chelating agents may also be used to buffer the polishing composition to maintain a desired pH level for processing a substrate. The chelating agents may also enhance the formation of the second passivation layer 890 on the substrate surface.

In any of the embodiments described herein, the inorganic or organic acid salts may be used to perform as a chelating agent. The polishing composition may include one or more inorganic or organic salts at a concentration between about 0.1% and about 15% by volume or weight of the composition, for example, between about 0.1% and about 8% by volume or weight. For example, about 2% by weight of ammonium citrate may be used in the polishing composition. The chelating agent may also be added in solution or in a substantially pure form, for example, ammonium citrate may be added in a 98% pure form.

Examples of suitable inorganic or organic acid salts include ammonium and potassium salts or organic acids, such as ammonium oxalate, ammonium citrate, ammonium succinate, monobasic potassium citrate, dibasic potassium citrate, tribasic potassium citrate, potassium tartarate, ammonium tartarate, potassium succinate, potassium oxalate, and combinations thereof. Additionally, ammonium and potassium salts of the carboxylate acids may also be used.

Alternatively, and additionally, one or more chelating agents can include compounds having one or more functional groups selected from the group of amine groups, amide groups, carboxylate groups, dicarboxylate groups, tricarboxylate groups, hydroxyl groups, a mixture of hydroxyl and carboxylate groups, and combinations thereof. The polishing composition may include one or more chelating agents at a concentration between about 0.1% and about 15% by volume or weight, but preferably utilized between about 0.1% and about 4% by volume or weight. For example, about 2% by volume of ethylenediamine may be used as a chelating agent.

Examples of suitable chelating agents having one or more carboxylate groups include citric acid, tartaric acid, succinic acid, oxalic acid, amino acids, salts thereof, and combinations thereof. For example, chelating agents may include ammonium citrate, potassium citrate, ammonium succinate, potassium succinate, ammonium oxalate, potassium oxalate, potassium tartrate, and combinations thereof. The salts may have multi-basic states, for example, citrates have mono-, di- and tri-basic states. Other suitable acids having one or more carboxylate groups include acetic acid, adipic acid, butyric acid, capric acid, caproic acid, caprylic acid, glutaric acid, glycolic acid, formaic acid, fumaric acid, lactic acid, lauric acid, malic acid, maleic acid, malonic acid, myristic acid, plamitic acid, phthalic acid, propionic acid, pyruvic acid, stearic acid, valeric acid, derivatives thereof, salts thereof and combinations thereof. Further examples of suitable chelating agents include compounds having one or more amine and amide functional groups, such as ethylenediamine (EDA), diethylenetriamine, diethylenetriamine derivatives, hexadiamine, amino acids, glycine, ethylenediaminetetraacetic acid (EDTA), methylformamide, derivatives thereof, salts thereof and combinations thereof. For example, EDTA includes the acid as well as a variety of salts, such as sodium, potassium and calcium (e.g., $Na_2EDTA$, $Na_4EDTA$, $K_4EDTA$ or $Ca_2EDTA$).

In any of the embodiments described herein, the corrosion inhibitors can be added to reduce the oxidation or corrosion of metal surfaces by enhancing the forming of the passivation layers that minimizes the chemical interaction between the substrate surface and the surrounding electrolyte. The layer of material formed by the corrosion inhibitors thus tends to suppress or minimize the electrochemical current from the substrate surface to limit electrochemical deposition and/or dissolution. The polishing composition may include between about 0.001% and about 5.0% by weight of the organic compound from one or more azole groups. The commonly preferred range being between about 0.2% and about 0.4% by weight. The corrosion inhibitor may also be added in solution or in a substantially pure form, for example, benzotriazole may be added in a 99% pure form.

Suitable corrosion inhibitors include compounds having a nitrogen atom (N), such as organic compounds having azole groups. Examples of organic compounds having azole groups include benzotriazole (BTA), mercaptobenzotriazole, 5-methyl-1-benzotriazole (TTA), and combinations thereof. Other suitable corrosion inhibitors include film forming agents that are cyclic compounds, for example, imidazole, benzimidazole, triazole, and combinations thereof. Derivatives of benzotriazole, imidazole, benzimidazole, triazole, with hydroxy, amino, imino, carboxy, mercapto, nitro and alkyl substituted groups may also be used as corrosion inhibitors. Other corrosion inhibitor includes urea and thiourea among others.

The residue composition includes polymeric inhibitors, which by chemical or physical means, form a layer of material which minimizes the chemical interaction between the substrate surface and the surrounding electrolyte. The layer of material formed by the inhibitors may suppress or minimize the electrochemical current from the substrate surface to limit electrochemical deposition and/or dissolution. By a physical mechanism, the second passivation layer 885 may be of a viscous form that inhibits fluid flow to and from the conductive material, limiting the removal rate of material therefrom.

Suitable polymeric inhibitors include compounds having a nitrogen atom (N), an oxygen atom (O), or a combination of the two. Polymeric inhibitors include ethylene imine based polymeric materials, such as polyethylene imine (PEI) having a molecular weight between about 400 and about 1000000 comprising (—$CH_2$—$CH_2$—NH—) monomer units, ethylene glycol based polymeric materials, such as polyethylene glycol (PEG) having a molecular weight between about 200 and about 100000 comprising ($OCH_2CH_2$)$_N$ monomer units. Polyamine and polyimide polymeric material may also be used as polymeric inhibitors in the composition. Other suitable polymeric inhibitors include oxide polymers, such as, polypropylene oxide and ethylene oxide propylene/oxide copolymer (EOPO), with a Molecular Weight range between about 200 and about 100000. An example of a suitable polymeric inhibitor includes XP-1296, containing polyamine polymer, commercially available from Rohm and Hass Electronic Materials of Marlborough, Mass., and Compound S-900, commercially available from Enthone-OMI Inc. of New Haven, Conn.

The polymeric inhibitor may be present in the composition of this invention in amounts ranging between about 0.001 wt. % and about 2 wt. %, such as between about 0.005 wt. % and about 1 wt. %, for example, between about 0.01 wt. % and about 0.5 vol %. A polymeric inhibitor of 2000 or 750000 molecular weight polyethylenimine in a concentration of about 0.025 wt. % may be used in the composition. More than one polymeric inhibitor may be included in the residual polishing composition. Some polymeric inhibitor may be added the composition in a solution, for example, the residual polishing composition may include 0.5 wt. % PEI with a 2000 molecular weight of a 5% aqueous PEI solution and/or 0.5 wt. % XP with a 2000 molecular weight of a 10% aqueous XP solution.

One or more pH adjusting agents is preferably added to the polishing composition to achieve a pH between about 2 and about 10, and preferably an acidic pH between about 3 and less than about 7. The amount of pH adjusting agent can vary as the concentration of the other components is varied in different formulations, but in general the total solution may include up and about 70 wt % of the one or more pH adjusting agents, but preferably between about 0.2% and about 25% by volume. Different compounds may provide different pH levels for a given concentration, for example, the composition may include between about 0.1% and about 10% by volume of a base, such as potassium hydroxide, ammonium hydroxide, sodium hydroxide or combinations thereof, providing the desired pH level. The one or more pH adjusting agents may be added the composition in a solution, for example, the residual polishing composition may include potassium hydroxide (KOH) of a 40% or 45% water solution.

The one or more pH adjusting agents can be chosen from a class of organic acids, for example, carboxylic acids, such as acetic acid, citric acid, oxalic acid, phosphate-containing components including phosphoric acid, ammonium phosphates, potassium phosphates, and combinations thereof, or a combination thereof. Inorganic acids including phosphoric acid, sulfuric acid, hydrochloric, nitric acid, derivatives thereof and combinations thereof, may also be used as a pH adjusting agent in the polishing composition.

The balance or remainder of the polishing compositions described herein is a solvent, such as a polar solvent, including water, preferably deionized water. Other solvent may be used solely or in combination with water, such as organic solvents. Organic solvents include alcohols, such as isopropyl alcohol or glycols, ethers, such as diethyl ether, furans, such as tetrahydrofuran, hydrocarbons, such as pentane or heptane, aromatic hydrocarbons, such as benzene or toluene, halogenated solvents, such as methylene chloride or carbon tetrachloride, derivatives, thereof and combinations thereof.

While not being limited to any particular theory, it is believed that a lone pair of electrons in the polymer's functional groups which include nitrogen (n) atom or oxygen (O) atom interact with the copper material on the surface to form a passivation layer. A corrosion inhibitor having a nitrogen atom may also contribute to forming the passivation layer with the polymeric passivation material. Chelating agents that have a donor electron or a lone pair of electrons may also contribute to the formation of the passivation layer in a similar manner. The passivation layer formed from the second polishing composition may mechanically interact with the exposed conductive material by forming a viscous layer that inhibits fluid flow, or mass transportation, of polishing composition to and from the exposed conductive material. The viscous layer may be formed from a phosphoric acid or phosphoric acid derivative. This inhibiting flow can be effective in reducing removal of copper material in recessed areas.

While the residual polishing compositions may be described as oxidizer free and/or abrasive free polishing compositions, an alterative embodiment of the composition may include an oxidizer, abrasive particles, or combinations thereof.

Optionally, the residual polishing composition may include one or more oxidizers. The oxidizer can be present in the polishing composition in an amount ranging between about 0.01% and about 100% by volume or weight, for example, between about 0.1% and about 20% by volume or weight. In an embodiment of the polishing composition, between about 0.1% and about 15% by volume or weight of hydrogen peroxide is present in the polishing composition. The oxidizer may be added to the composition in a solution, such as a 30% aqueous hydrogen peroxide solution or a 40% aqueous hydrogen peroxide solution.

In one embodiment, the oxidizer is added to the rest of the polishing composition just prior to beginning the electrochemical mechanical polishing process. Examples of suitable oxidizers include peroxy compounds, e.g., compounds that may disassociate through hydroxy radicals, such as hydrogen peroxide and its adducts including urea hydrogen peroxide, percarbonates, and organic peroxides including, for example, alkyl peroxides, cyclical or aryl peroxides, benzoyl peroxide, peracetic acid, and ditertbutyl peroxide. Sulfates and sulfate derivatives, such as monopersulfates and dipersulfates may also be used including for example, ammonium peroxydisulfate, potassium peroxydisulfate, ammonium persulfate, and potassium persulfate. Salts of peroxy compounds, such as sodium percarbonate and sodium peroxide may also be used.

The oxidizer can also be an inorganic compound or a compound containing an element in its highest oxidation state. Examples of inorganic compounds and compounds containing an element in its highest oxidation state include but are not limited to periodic acid, periodate salts, perbromic acid, perbromate salts, perchloric acid, perchloric salts, perbonic acid, nitrate salts (such as cerium nitrate, iron nitrate, ammonium nitrate), ferrates, perborate salts and permanganates. Other oxidizers include bromates, chlorates, chromates, iodates, iodic acid, and cerium (IV) compounds such as ammonium cerium nitrate.

Optionally, abrasive particles, referred to as abrasives, may may comprise up and about 30 wt % of the residual polishing composition during processing, such as a concentration between about 0.001 wt % and about 5 wt % of abrasive particles in the bulk polishing composition.

Suitable abrasives particles include inorganic abrasives, polymeric abrasives, and combinations thereof. Inorganic abrasive particles that may be used in the electrolyte include, but are not limited to, silica, alumina, zirconium oxide, titanium oxide, cerium oxide, germania, or any other abrasives of metal oxides, known or unknown. For example, colloidal silica may be positively activated, such as with an alumina modification or a silica/alumina composite. The typical abrasive particle size used in one embodiment of the current invention is generally between about 1 nm and about 1,000 nm, preferably between about 10 nm and about 100 nm. Generally, suitable inorganic abrasives have a Mohs hardness of greater than 6, although the invention contemplates the use of abrasives having a lower Mohs hardness value.

The polymer abrasives described herein may also be referred to as "organic polymer particle abrasives", "organic abrasives" or "organic particles." The polymeric abrasives may comprise abrasive polymeric materials. Examples of polymeric abrasives materials include polymethylmethacrylate, polymethyl acrylate, polystyrene, polymethacrylonitrile, and combinations thereof.

The polymeric abrasives may have a Hardness Shore D of between about 60 and about 80, but can be modified to have greater or lesser hardness value. The softer polymeric abrasive particles can help reduce friction between a polishing article and substrate and may result in a reduction in the number and the severity of scratches and other surface defects as compared to inorganic particles. A harder polymeric abrasive particle may provide improved polishing performance, removal rate and surface finish as compared to softer materials. The hardness of the polymer abrasives can be varied by controlling the extent of polymeric cross-linking in the abrasives, for example, a higher degree of cross-linking produces a greater hardness of polymer and, thus, abrasive. The polymeric abrasives are typically formed as spherical shaped beads having an average diameter between about 0.1 micron and about 20 microns or less.

The polymeric abrasives may be modified to have functional groups, e.g., one or more functional groups, that have an affinity for, i.e., can bind to, the conductive material or conductive material ions at the surface of the substrate, thereby facilitating the electrochemical mechanical polishing removal of material from the surface of a substrate. For example, if copper is to be removed in the polishing process, the organic polymer particles can be modified to have an amine group, a carboxylate group, a pyridine group, a hydroxide group, ligands with a high affinity for copper, or combinations thereof, to bind the removed copper as substitutes for or in addition to the chemically active agents in the bulk polishing composition, such as the chelating agents or corrosion inhibitors. The substrate surface material, such as copper, may be in any oxidation state, such as 0, 1+, or 2+, before, during or after ligating with a functional group. The functional groups can bind to the metal material(s) on the substrate surface to help improve the uniformity and surface finish of the substrate surface.

Additionally, the polymeric abrasives have desirable chemical properties, for example, the polymer abrasives are stable over a broad pH range and are not prone to aggregating to each other, which allow the polymeric abrasives to be used with reduced or no surfactant or no dispersing agent in the composition.

Alternatively, inorganic particles coated with the polymeric materials described herein may also be used with the bulk polishing composition. It is within the scope of the current invention for the bulk polishing composition to contain polymeric abrasives, inorganic abrasives, the polymeric coated inorganic abrasives, and any combination thereof depending on the desired polishing performance and results.

The residual polishing composition may include one or more additive compounds. Additive compounds include electrolyte additives including, but not limited to, suppressors, enhancers, levelers, brighteners, stabilizers, and stripping agents to improve the effectiveness of the residual polishing composition in polishing of the substrate surface. For example, certain additives may decrease the ionization rate of the metal atoms, thereby inhibiting the dissolution process, whereas other additives may provide a finished, shiny substrate surface. The additives may be present in the residual polishing composition in concentrations up and about 15% by weight or volume, and may vary based upon the desired result after polishing.

Electrochemical mechanical polishing compositions of varying compositions may be used to remove bulk material and residual material, such as copper and/or copper alloys, as well as to remove barrier materials, such as tantalum nitrides or titanium nitrides. Specific formulations of the polishing compositions are used to remove the particular materials. Polishing compositions utilized during embodiments herein are advantageous for electrochemical mechanical polishing processes. Generally, electrochemical mechanical polishing compositions are much more conductive than traditional CMP solutions. The electrochemical mechanical polishing compositions have a conductivity of about 10 mS/cm or higher, while traditional CMP solutions have a conductivity between about 3 mS/cm and about 5 mS/cm. The conductivity of the electrochemical mechanical polishing compositions greatly influences that rate at which the electrochemical mechanical polishing process advances, i.e., more conductive solutions have a faster material removal rate. For removing bulk material, the electrochemical mechanical polishing composition has a conductivity of about 10 mS/cm or higher, for example, between about 10 mS/cm and about 100 mS/cm, preferably in a range between about 30 mS/cm and about 60 mS/cm. For residual material, the electrochemical mechanical polishing composition has a conductivity of about 10 mS/cm or higher, for example, between about 10 mS/cm and about 100 mS/cm, preferably in a range between about 20 mS/cm and about 80 mS/cm.

It has been observed that a substrate processed with the polishing composition described herein has improved surface finish, including less surface defects, such as dishing, erosion (removal of dielectric material surrounding metal features), and scratches, as well as improved planarity.

The following non-limiting examples are provided to further illustrate embodiments of the invention. However, the examples are not intended to be all-inclusive and are not intended to limit the scope of the inventions described herein.

The compositions described herein may be further disclosed by the examples as follows.

EXAMPLES

The following non-limiting examples are provided to further illustrate embodiments of the invention. However, the examples are not intended to be all-inclusive and are not intended to limit the scope of the inventions described herein.

Examples of residual compositions include:

Example 1 about 5.1 vol % of phosphoric acid;
about 2 wt. % of ammonium citrate;
about 0.3 wt. % of benzotriazole;
about 0.5 vol % of XP-1296;

about 0.025 vol % of 750000 molecular weight polyethylene imine (PEI);
deionized water; and
potassium hydroxide to provide a pH of about 5.75.

Example 2 about 5.1 vol % of phosphoric acid;
about 2 wt. % of ammonium citrate;
about 0.3 wt % of benzotriazole;
about 0.5 vol % of XP-1296;
about 0.025 vol % of 2000 molecular weight polyethylene imine (PEI);
deionized water; and
potassium hydroxide to provide a pH of about 5.75.

Example 3 about 5.1 vol % of phosphoric acid;
about 2 wt. % of ammonium citrate;
about 0.3 wt. % of benzotriazole;
about 0.5 vol % of XP-1296;
about 0.5 vol % of Compound S-900;
deionized water; and
potassium hydroxide to provide a pH of about 5.75.
Examples of multi-step polishing processes include:

Example 1

A copper plated substrate with 300 mm diameter was polished and planarized using the following polishing composition within a modified cell on a REFLEXION® system, available from Applied Materials, Inc. of Santa Clara, Calif. A substrate having a copper layer of about 11,500 Å thick on the substrate surface with a step height of about 6,000 Å was placed onto the first platen and exposed to a polishing composition of:
about 6% by volume phosphoric acid (85% aqueous solution);
about 2% by volume ethylenediamine;
about 2% by weight ammonium citrate;
about 0.3% by weight benzotriazole;
between about 2% and about 6% by volume 40% KOH solution to provide a pH of about 5;
about 1.5% by volume of hydrogen peroxide (30% aqueous solution, for about 0.45 vol % hydrogen peroxide);
about 0.15% by weight of silica ($SiO_2$) abrasive particles; and
de-ionized water.

The substrate was contacted with the first polishing article at a first contact pressure of about 0.3 psi, a first platen rotational rate of about 7 rpm, a first carrier head rotational rate of about 23 rpm and a first bias of about 3 volts was applied during the process. The substrate was polished and examined. The copper layer thickness was reduced and about 1,500 Å.

The substrate was transferred to over a second platen having a second polishing article disposed thereon. A second polishing composition was supplied to the platen at a rate of about 300 mL/min, and the second polishing composition comprising:
about 5.1 vol % of phosphoric acid;
about 2 wt. % of ammonium citrate;
about 0.3 wt. % of benzotriazole;
about 0.5 vol % of XP-1296;
about 0.025 vol % of 750000 molecular weight polyethylenimine (PEI);

potassium hydroxide to provide a pH of about 5.75; and
de-ionized water.

The substrate was contacted with the second polishing article at a second contact pressure of about 0.3 psi, a second platen rotational rate of about 20 rpm, a second carrier head rotational rate of about 21 rpm and a second bias of about 2.0 volts was applied during the process. The substrate was polished and examined. The excess copper layer formerly on the substrate surface was removed to leave behind the barrier layer and the copper trench.

Example 2

A copper plated substrate with 300 mm diameter was polished and planarized using the following polishing composition within a modified cell on a REFLEXION® system, available from Applied Materials, Inc. of Santa Clara, Calif. A substrate having a copper layer of about 11,500 Å thick on the substrate surface with a step height of about 6,000 Å was placed onto the first platen and exposed to a polishing composition of:
about 6% by volume phosphoric acid (85% aqueous solution);
about 2% by volume ethylenediamine;
about 2% by weight ammonium citrate;
about 0.3% by weight benzotriazole;
between about 2% and about 6% by volume 40% KOH solution to provide a pH of about 5;
about 1.5% by volume of hydrogen peroxide (30% aqueous solution, for about 0.45 vol % hydrogen peroxide);
about 0.15% by weight of silica ($SiO_2$) abrasive particles; and
de-ionized water.

The substrate was contacted with the first polishing article at a first contact pressure of about 0.3 psi, a first platen rotational rate of about 7 rpm, a first carrier head rotational rate of about 23 rpm and a first bias of about 3 volts was applied during the process. The substrate was polished and examined. The copper layer thickness was reduced and about 1,500 Å.

The substrate was transferred to over a second platen having a second polishing article disposed thereon. A second polishing composition was supplied to the platen at a rate of about 300 mL/min, and the second polishing composition comprising:
about 5.1 vol % of phosphoric acid;
about 2 wt. % of ammonium citrate;
about 0.3 wt. % of benzotriazole;
about 0.5 vol % of XP-1296;
about 0.025 vol % of 2000 molecular weight polyethylene imine (PEI);
potassium hydroxide to provide a pH of about 5.75; and
de-ionized water.

The substrate was contacted with the second polishing article at a second contact pressure of about 0.3 psi, a second platen rotational rate of about 20 rpm, a second carrier head rotational rate of about 21 rpm and a second bias of about 2.0 volts was applied during the process. The substrate was polished and examined. The excess copper layer formerly on the substrate surface was removed to leave behind the barrier layer and the copper trench.

Example 3

A copper plated substrate with 300 mm diameter was polished and planarized using the following polishing composition within a modified cell on a REFLEXION® system, available from Applied Materials, Inc. of Santa Clara, Calif. A substrate having a copper layer of about 11,500 Å thick on the substrate surface with a step height of about 6,000 Å was placed onto the first platen and exposed to a polishing composition of:

about 6% by volume phosphoric acid (85% aqueous solution);
about 2% by volume ethylenediamine;
about 2% by weight ammonium citrate;
about 0.3% by weight benzotriazole;
between about 2% and about 6% by volume 40% KOH solution to provide a pH of about 5;
about 1.5% by volume of hydrogen peroxide (30% aqueous solution, for about 0.45 vol % hydrogen peroxide);
about 0.15% by weight of silica ($SiO_2$) abrasive particles; and
de-ionized water.

The substrate was contacted with the first polishing article at a first contact pressure of about 0.3 psi, a first platen rotational rate of about 7 rpm, a first carrier head rotational rate of about 23 rpm and a first bias of about 3 volts was applied during the process. The substrate was polished and examined. The copper layer thickness was reduced and about 1,500 Å.

The substrate was transferred to over a second platen having a second polishing article disposed thereon. A second polishing composition was supplied to the platen at a rate of about 300 mL/min, and the second polishing composition comprising:

about 5.1 vol % of phosphoric acid;
about 2 wt. % of ammonium citrate;
about 0.3 wt. % of benzotriazole;
about 0.5 vol. % of XP-1296;
about 0.5 vol % of Compound S-900;
potassium hydroxide to provide a pH of about 5.75; and
de-ionized water.

The substrate was contacted with the second polishing article at a second contact pressure of about 0.3 psi, a second platen rotational rate of about 20 rpm, a second carrier head rotational rate of about 21 rpm and a second bias of about 2.0 volts was applied during the process. The substrate was polished and examined. The excess copper layer formerly on the substrate surface was removed to leave behind the barrier layer and the copper trench.

While the foregoing is directed to embodiments of the present invention, other and further embodiments of the invention may be devised without departing from the basic scope thereof, and the scope thereof is determined by the claims that follow.

What is claimed is:

1. A method of processing a substrate, comprising:
    disposing a substrate having a conductive material layer formed thereon in a process apparatus comprising a first electrode and a second electrode, wherein the substrate is in electrical contact with the second electrode;
    providing a polishing composition between the first electrode and the substrate, wherein the polishing composition initially comprises:
        an acid based electrolyte system;
        a chelating agent;
        a corrosion inhibitor;
        a passivating polymeric material;
        a basic pH adjusting agent in an amount sufficient to provide a pH between about 3 and about 10; and
        a solvent; and
    contacting the substrate to a polishing article;
    providing relative motion between the substrate and the polishing article;
    applying a bias between the first electrode and the second electrode; and
    removing conductive material from the substrate surface.

2. The method of claim 1, wherein the contacting the substrate to a polishing article comprises applying a pressure between the substrate and the polishing article of between about 0.1 psi and about 1 psi and the providing relative motion comprises rotating the polishing article between about 1 rpm and about 80 rpm and rotating the substrate article between about 1 rpm and about 80 rpm.

3. The method of claim 1, wherein the applying the bias comprises applying a current density between about 3 mA/cm$^2$ and about 20 mA/cm$^2$ to the substrate.

4. The method of claim 3, wherein the applying the bias comprises applying a bias between about 1.5 volts and about 3 volts between the first and second electrodes.

5. The method of claim 1, wherein the composition comprises:
    between about 1 vol % and about 10 vol % of the acid based electrolyte;
    between about 0.1 wt % and about 6 wt % of the chelating agent;
    between about 0.01 wt. % and about 1 wt. % of the corrosion inhibitor;
    between about 0.001 vol % and about 2 vol % of the passivating polymeric material;
    between about 1 wt. % and about 20 wt. % of the basic pH adjusting agent; and
    water;
    wherein the basic pH adjusting agent is added in an amount sufficient to provide a pH between about 4 and less than about 7.

6. The method of claim 5, wherein the composition further comprises about 0.5% by weight of a second passivating polymeric material.

7. The method of claim 1, wherein the composition further comprises an oxidizer, abrasive particles, or combinations thereof.

8. The method of claim 1, wherein the passivating polymeric material.

9. A method of processing a substrate having a conductive material layer disposed thereon, comprising:
    providing the substrate to a process apparatus;
    exposing the substrate to a first polishing composition;
    contacting the substrate to a polishing article;
    providing relative motion between the substrate and the polishing article;
    applying a first bias to the substrate;
    removing at least 50% of the conductive material layer;
    exposing the substrate to a second polishing composition initially comprising:
        an acid based electrolyte;
        a chelating agent;
        a corrosion inhibitor;
        a passivating polymeric material;
        a basic pH adjusting agent in an amount sufficient to provide a pH between about 3 and about 10; and
        a solvent; and
    contacting the substrate to the polishing article;
    providing relative motion between the substrate and the polishing article;
    applying a second bias to the substrate; and
    removing the conductive layer.

10. The method of claim 9, wherein the conductive material layer comprises copper or a copper alloy.

11. The method of claim 9, wherein the first polishing composition comprises:
   between about 1 wt % and about 10 wt % of phosphoric acid;
   between about 0.1 wt % and about 6 wt % of at least one chelating agent;
   between about 0.01 wt % and about 1 wt % of a corrosion inhibitor;
   between about 0.5 wt % and about 10 wt % of a salt;
   between about 0.2 wt % and about 5 wt % of an oxidizer;
   between about 0.05 wt % and about 1 wt % of an abrasive particulates;
   deionized water; and
   at least one pH adjusting agent to provide a pH between about 4 and about 7.

12. The method of claim 9 wherein the contacting the substrate to a polishing article comprises applying a pressure between the substrate and the polishing article of between about 0.1 psi and about 1 psi and the providing relative motion comprises rotating the polishing article between about 1 rpm and about 80 rpm and rotating the substrate between about 1 rpm and about 80 rpm.

13. The method of claim 9, wherein the applying the first bias comprises applying a bias between about 2.6 volts and about 3.5 volts between the first and second electrodes and the applying the second bias comprises applying a bias between about 1.5 volts and about 3 volts between the first and second electrodes.

14. The method of claim 9, wherein the second composition comprises:
   between about 1 vol % and about 10 vol % of the acid based electrolyte;
   between about 0.1 vol % and about 6 vol % of the chelating agent;
   between about 0.01 wt. % and about 1 wt. % of the corrosion inhibitor;
   between about 0.01 vol % and about 2 vol % of the passivating polymeric material;
   between about 1 wt. % and about 20 wt. % of the basic pH adjusting agent; and
   a solvent;
   wherein the basic pH adjusting agent is added in an amount sufficient to provide a pH between about 4 and less than about 7.

15. The method of claim 14, wherein the second composition initially comprises:
   about 5.1% by volume phosphoric acid;
   about 2% by weight ammonium citrate;
   about 0.3% by weight of benzotriazole;
   about 0.025% by volume of 750000 molecular weight polyetheyleneimine;
   sufficient potassium hydroxide to provide a pH of about 5.75; and
   deionized water.

16. The method of claim 15, wherein the second composition further comprises about 0.5% by weight of a second passivating polymeric material.

17. The method of claim 9, wherein the composition further comprises an oxidizer, abrasive particles, or combinations thereof.

18. The method of claim 9, wherein the passivating polymeric material comprises a polymeric material having a functional group containing a nitrogen atom, an oxygen atom, or a combination thereof, and is selected from the group of polyethylene glycol, polyethylene imine, polyamines, and combinations thereof.

19. A method of processing a substrate, comprising:
   disposing a substrate having a conductive material layer formed thereon in a process apparatus comprising a first electrode and a second electrode, wherein the substrate is in electrical contact with the second electrode;
   providing a polishing composition between the first electrode and the substrate wherein the polishing composition initially comprises:
      about 5.1% by volume phosphoric acid;
      about 2% by weight ammonium citrate;
      about 0.3% by weight of benzotriazole;
      about 0.025% by volume of 750000 molecular weight polyetheyleneimine;
      potassium hydroxide to provide a pH of about 5.75; and
      the remainder deionized water;
   contacting the substrate to a polishing article;
   providing relative motion between the substrate and the polishing article;
   applying a bias between the first electrode and the second electrode; and
   removing conductive material from the substrate surface.

20. The method of claim 19, wherein the polishing composition further comprises about 0.5% by weight of a second passivating polymeric material.

* * * * *